(12) United States Patent
Govil

(10) Patent No.: US 8,169,426 B2
(45) Date of Patent: May 1, 2012

(54) METHOD AND APPARATUS FOR SENSING, MEASUREMENT OR CHARACTERIZATION OF DISPLAY ELEMENTS INTEGRATED WITH THE DISPLAY DRIVE SCHEME, AND SYSTEM AND APPLICATIONS USING THE SAME

(75) Inventor: Alok Govil, Santa Clara, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 550 days.

(21) Appl. No.: 12/369,678

(22) Filed: Feb. 11, 2009

(65) Prior Publication Data

US 2010/0039409 A1  Feb. 18, 2010

Related U.S. Application Data

(60) Provisional application No. 61/027,727, filed on Feb. 11, 2008.

(51) Int. Cl.
*G06F 3/038* (2006.01)
(52) U.S. Cl. ......................... 345/204; 345/208
(58) Field of Classification Search .................. None
See application file for complete search history.

(56) References Cited

U.S. PATENT DOCUMENTS

| | | |
|---|---|---|
| 5,559,358 A | 9/1996 | Burns et al. |
| 5,835,255 A | 11/1998 | Miles |
| 5,835,256 A | 11/1998 | Huibers |
| 6,040,937 A | 3/2000 | Miles |
| 6,077,452 A | 6/2000 | Litvak |
| 6,160,541 A | 12/2000 | Palalau et al. |
| 6,275,326 B1 | 8/2001 | Bhalla et al. |
| 6,285,207 B1 | 9/2001 | Listwan |
| 6,509,620 B2 | 1/2003 | Hartwell et al. |
| 6,526,829 B1 | 3/2003 | Lysen et al. |
| 6,529,654 B1 | 3/2003 | Wong et al. |
| 6,567,715 B1 | 5/2003 | Sinclair et al. |
| 6,630,834 B2 | 10/2003 | Min et al. |
| 6,657,218 B2 | 12/2003 | Noda |

(Continued)

FOREIGN PATENT DOCUMENTS

| | | |
|---|---|---|
| EP | 1 004 910 | 5/2000 |
| EP | 1 630 779 | 3/2006 |
| EP | 1 630 781 | 3/2006 |

(Continued)

OTHER PUBLICATIONS

Conner, "Hybrid Color Display Using Optical Interference Filter Array," SID Digest, pp. 577-580 (1993).
van Drieenhuizen, et al., "Comparison of Techniques for measuring Both Compressive and Tensile Stress in Thin Films." Sensors and Actuators, vol. 37-38, pp. 759-765. (1993).

(Continued)

*Primary Examiner* — Paul Huber
(74) *Attorney, Agent, or Firm* — Knobbe Martens Olson & Bear, LLP

(57) ABSTRACT

Methods and systems for electrical sensing, measurement and characterization of display elements are described. An embodiment includes integrating the electrical sensing, measurement and characterization with the display drive scheme. This embodiment allows for measurement of DC or operational hysteresis voltages and/or response times of interferometric modulator MEMS devices, for example, to be fully integrated with the display driver IC and/or the display drive scheme. Another embodiment allows these measurements to be performed and used without resulting in display artifacts visible to a human user. Another embodiment allows the measurement circuitry to be integrated with the display driver IC and/or the display drive scheme re-using several existing circuitry components and features, thus allowing for integration of the measurement method and its use relatively easily.

33 Claims, 17 Drawing Sheets

U.S. PATENT DOCUMENTS

| | | |
|---|---|---|
| 6,674,562 B1 | 1/2004 | Miles |
| 6,734,977 B2 | 5/2004 | Noda |
| 6,771,851 B1 | 8/2004 | Yang |
| 6,781,702 B2 | 8/2004 | Giannakopoulos et al. |
| 6,845,190 B1 | 1/2005 | Smithwick et al. |
| 6,950,193 B1 | 9/2005 | Discenzo |
| 6,998,851 B2 | 2/2006 | van Spengen |
| 7,026,821 B2 | 4/2006 | Martin |
| 7,075,700 B2 | 7/2006 | Meunter |
| 7,123,216 B1 | 10/2006 | Miles |
| 7,126,741 B2 | 10/2006 | Wagner et al. |
| 7,218,172 B2 | 5/2007 | Blodgett |
| 7,327,510 B2 | 2/2008 | Cummings et al. |
| 7,339,384 B2 | 3/2008 | Peng et al. |
| 7,355,936 B2 | 4/2008 | Senshu |
| 7,412,775 B1 | 8/2008 | Karnick et al. |
| 7,423,287 B1 | 9/2008 | U'Ren et al. |
| 7,453,579 B2 | 11/2008 | Kothari et al. |
| 7,525,730 B2 | 4/2009 | Floyd |
| 7,551,159 B2 | 6/2009 | Mignard et al. |
| 7,580,176 B2 | 8/2009 | Cummings et al. |
| 7,586,602 B2 | 9/2009 | Maity et al. |
| 2002/0050960 A1* | 5/2002 | Setoguchi et al. ............. 345/60 |
| 2002/0075555 A1 | 6/2002 | Miles |
| 2003/0080811 A1 | 5/2003 | Nakatani et al. |
| 2003/0102858 A1 | 6/2003 | Jacobson et al. |
| 2004/0042000 A1 | 3/2004 | Mehrl et al. |
| 2004/0218341 A1 | 11/2004 | Martin et al. |
| 2004/0223204 A1 | 11/2004 | Mao et al. |
| 2005/0030551 A1 | 2/2005 | Rosakis et al. |
| 2005/0042777 A1 | 2/2005 | Boger et al. |
| 2005/0206991 A1 | 9/2005 | Chui et al. |
| 2005/0237276 A1* | 10/2005 | Tsuchida et al. ................ 345/63 |
| 2005/0242904 A1 | 11/2005 | Lutz et al. |
| 2006/0044298 A1 | 3/2006 | Mignard et al. |
| 2006/0044928 A1* | 3/2006 | Chui et al. ..................... 365/232 |
| 2006/0050350 A1 | 3/2006 | Rijks et al. |
| 2006/0066863 A1 | 3/2006 | Cummings et al. |
| 2006/0067653 A1 | 3/2006 | Gally et al. |
| 2006/0077401 A1 | 4/2006 | Kothari et al. |
| 2006/0103643 A1 | 5/2006 | Mathew et al. |
| 2006/0114243 A1 | 6/2006 | Iwasaki |
| 2006/0243023 A1 | 11/2006 | Wong |
| 2007/0053652 A1* | 3/2007 | Mignard et al. ............. 385/147 |
| 2007/0075942 A1 | 4/2007 | Martin et al. |
| 2007/0080695 A1 | 4/2007 | Morrell et al. |
| 2007/0127186 A1 | 6/2007 | Ivanciw et al. |
| 2007/0201038 A1 | 8/2007 | Cummings et al. |
| 2008/0119716 A1 | 5/2008 | Boric-Lubecke et al. |
| 2009/0051369 A1 | 2/2009 | Kogut et al. |
| 2010/0321761 A1 | 12/2010 | Cummings et al. |

FOREIGN PATENT DOCUMENTS

| | | |
|---|---|---|
| EP | 1 640 962 | 3/2006 |
| EP | 1640962 A2 * | 3/2006 |
| GB | 2 217 839 | 11/1989 |
| WO | WO 01/73934 | 10/2001 |
| WO | WO 02/093116 | 11/2002 |
| WO | WO 2006/036391 | 4/2006 |
| WO | WO 2006/036847 | 4/2006 |
| WO | WO 2007/043051 | 4/2007 |
| WO | WO 2007/124357 | 11/2007 |
| WO | WO 2007/149284 | 12/2007 |

OTHER PUBLICATIONS

Guckel et al., "Fine-Grained Polysilicon Films with Built-In Tensile Strain," IEEE Transactions on Electron Devices, vol. 35, No. 6, pp. 801-802, (1988).
Jerman et al., "A Miniature Fabry-Perot Interferometer with a Corrugated Silicon Diaphragm Support," IEEE Electron Devices Society (1988).
Lin et al., "A Micro Strain Gauge with Mechanical Amplifier," J. of Microelectromechanical Systems, vol. 6, No. 4, (1997).
Miles, "MEMS-based interferometric modulator for display applications," Proc. SPIE vol. 3876, pp. 20-28, Sep. 1999.
Miles, "5.3: Digital Paper™: Reflective Displays Using Interferometric Modulation," SID 00 Digest, pp. 32-35 (2000).
Miles, 10.1: Digital Paper™ for Reflective Displays, SID 02 Digest, pp. 115-117 (2002).
Miles et al., "Digital Paper™ for Reflective Displays," J. of the Society for Information Display Soc. Inf. Display USA. vol. 11, No. 1, p. 209-215. (2003).
Raley et al., "A Fabry-Perot Microinterferometer for Visible Wavelengths," IEEE Solid-State Sensor and Actuator Workshop, Hilton Head, SC (1992).
Singh et al., "Strain Studies in LPCVD Polysilicon for Surface Micromachined Devices," Sensors and Actuators, vol. 77, pp. 133-138, (1999).
Srikar et al., "A Critical Review of Microscale Mechanical Testing Methods Used in the Design of Microelectromechanical Systems," Society for Experimental mechanics, vol. 43, No. 3, (2003).
Zhang, et al., "Measurements of Residual Stresses in Thin Films Using Micro-Rotating-Structures." Thin Solid Films, vol. 335, pp. 97-105, (1998).
Braghin et al., 2006, Nonlinear dynamics of vibrating MEMS, Sensors and Actuators A, 134((1):98-108.
Castaner et al., Sep. 1999, Speed-energy optimization of electrostatic actuators based on pull-in, Journal of Microelectromechanical Systems, 8(3):290-298.
Karkkainen et al., Jun. 2004, AC voltage reference based on a capacitive micromechanical component, Precision Electromagnetic Measurements Digest, 119-120.
Mol et al., 2005, High-resolution capacitate measurement of microstructure displacement using coherent detection, Eurosensors XIX Conference, Barcelona, Spain, 4 pp.
Murakoshi et al., 2003, Electrostatically levitated ring-shaped rotational-gyro/accelerometer, Japanese Journal of Applied Physics, 42(48):2468-2472.
Panchawagh et al., 2008, Characterization of silicon parallel-plate electrostatic actuator in partially conducting aqueous solution, MEMS 2008, Tucson, AZ, pp. 495-498.
Pons-Nin et al., Jun. 2002, Voltage and pull-in time in current drive of electrostatic actuators, Journal of Microelectromechanical Systems, 11(3):196-205.
Zhang et al., Mar. 2007, Nonlinear dynamic analysis of electrostatically actuated resonant MEMS sensors under parametric excitation, Sensors Journal, 7(3):370-380.
Zhao et al., 2004, A study of dynamic characteristics and simulation of MEMS torsional micromirrors, Sensors and Actuators A, 120(1):199-210.
Castaner et al., May 1, 2000, Pull-in time-energy product of electrostatic actuators: comparison of experiments with simulation, Sensors and Actuators, 83(1-3):263-269.
IPRP for PCT/US09/033445 dated Apr. 29, 2010.
IPRP for PCT/US09/033435 dated May 28, 2010.
IPRP for PCT/US09/33419, dated May 17, 2010.
Cigada et al., Feb. 28, 2007, Electrical method to measure the dynamic behaviour and the quadrature error of a MEMS gyroscope sensor, Sensors and Actuators, 134(1):88-97.
Langfelder et al., 2008, Low-noise real-time measurement of the position of movable structures in MEMS, Sensors and Actuators, 148(2):401-406.
Osterberg et al., 1997, M-test: a test chip for MEMS material property measurement using electrostatically actuated test structures, Journal of Microelectricalmechanical Systems, 6(2):107-118.
Uranga et al., May 6, 2007. Electrical detection of multiple resonant modes in a CMOS-MEMS cantilever, Microelectronic Engineering 84(5-8):1374-1378.
ISR and WO for PCT/US09/033445 dated Jun. 19, 2009.
ISR and WO for PCT/US09/033435 dated Jun. 24, 2009.
ISR and WO for PCT/US09/33419, dated Jun. 12, 2009.
Dumas et al., 2007, A novel approach for online sensor testing based on an encoded test stimulus, 12th IEEE European Test Symposium, pp. 105-110.
International Business Machines Corporation, Apr. 1, 2000, Half contact array testing method for TFT array, Research Disclosure, Mason Publications, Hampshire, GB, 423(167), abstract, 1 p.
Jin et al., 1998, Electrostatic resonator with second superharmonic resonance, Sensors and Actuators A, 64:273-279.
Office Action dated Aug. 22, 2011 in U.S. Appl. No. 12/369,620.
Office Action dated Aug. 22, 2011 in U.S. Appl. No. 12/369,652.

* cited by examiner

| | Column Output Signals | |
|---|---|---|
| | $+V_{bias}$ | $-V_{bias}$ |
| Row Output Signals   0 | Stable | Stable |
| $+\Delta V$ | Relax | Actuate |
| $-\Delta V$ | Actuate | Relax |

200C

250: APPLY A DRIVE VOLTAGE BETWEEN A FIRST ELECTRODE AND A SECOND ELECTRODE OF A DISPLAY ELEMENT, WHEREIN THE DRIVE VOLTAGE IS AT A LEVEL PREDETERMINED TO RESULT IN THE DISPLAY ELEMENT BEING IN A FIRST OF PLURALITY OF DISPLAY STATES

252: MEASURE AN ELECTRICAL RESPONSE OF THE DISPLAY ELEMENT IN RESPONSE TO THE APPLIED DRIVE VOLTAGE

254: RECEIVE INFORMATION INDICATIVE OF THE MEASURED ELECTRICAL RESPONSE AND IDENTIFY AN ERROR IN OPERATION OF THE DISPLAY ELEMENT BASED UPON THE MEASURED ELECTRICAL RESPONSE

256: ADJUST THE DRIVE VOLTAGE OF THE DISPLAY ELEMENT IN RESPONSE TO THE IDENTIFIED ERROR

258: STORE INFORMATION INDICATIVE OF THE ADJUSTED DRIVE VOLTAGE

*FIG. 10C*

METHOD AND APPARATUS FOR SENSING, MEASUREMENT OR CHARACTERIZATION OF DISPLAY ELEMENTS INTEGRATED WITH THE DISPLAY DRIVE SCHEME, AND SYSTEM AND APPLICATIONS USING THE SAME

CROSS REFERENCE TO RELATED APPLICATIONS

This application claims priority to U.S. Provisional Application No. 61/027,727, filed on Feb. 11, 2008, entitled "METHOD AND APPARATUS FOR SENSING, MEASUREMENT OR CHARACTERIZATION OF DISPLAY ELEMENTS INTEGRATED WITH THE DISPLAY DRIVE SCHEME, AND SYSTEM AND APPLICATIONS USING THE SAME," the disclosure of which is hereby incorporated by reference in its entirety.

BACKGROUND

1. Field of the Invention

This invention relates to microelectromechanical systems. More particularly, this invention relates to methods and apparatus for improving the performance of microelectromechanical systems such as interferometric modulators.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

The systems, methods, and devices described herein each have several aspects, no single one of which is solely responsible for its desirable attributes. Without limiting the scope, prominent features will now be discussed briefly. After considering this discussion, and particularly after reading the section entitled "Detailed Description of Certain Embodiments" one will understand how the features described herein provide advantages over other display devices.

SUMMARY

One aspect is a method, including applying a signal waveform between a first electrode and a second electrode of a display element, where the signal alters a state of the display element from a first state to a second state and back to the first state, where the transition from the first state to the second state and back to the first state is substantially undetectable to human vision, measuring an electrical response of the display element in response to the applied signal, and determining at least one operational characteristic of the display element based on the measured electrical response.

Another aspect is an apparatus, including drive circuitry configured to apply a signal between a first electrode and a second electrode of a display element, where the signal alters a state of the display element from a first state to a second state and back to the first state, where the transition from the first state to the second state and back to the first state is substantially undetectable to human vision, feedback circuitry configured to measure an electrical response of the display element in response to the applied voltage waveform, and a processor configured to control the drive circuitry, receive information indicative of the measured electrical response, and determine at least one operational characteristic of the display element based on the measured electrical response.

Another aspect is a display device, including means for applying a signal between a first electrode and a second electrode of a display element, where the signal alters a state of the display element from a first state to a second state and back to the first state, where the transition from the first state to the second state and back to the first state is substantially undetectable to human vision, means for measuring an electrical response of the display element in response to the applied voltage waveform, and means for receiving information indicative of the measured electrical response and for determining at least one operational characteristic of the display element based on the measured electrical response.

Another aspect is a display device including an array of interferometric modulators, drive circuitry configured to apply a signal between a first electrode and a second electrode of at least one of the interferometric modulators, where the signal alters a state of the interferometric modulator from a first state to a second state and back to the first state, where the transition from the first state to the second state and back to the first state is substantially undetectable to human vision, feedback circuitry configured to measure an electrical response of the interferometric modulator in response to the applied voltage waveform, a processor configured control the drive circuitry, receive information indicative of the measured electrical response, and determine at least one operational characteristic of the interferometric modulator based on the measured electrical response, and a memory device configured to communicate with the processor.

BRIEF DESCRIPTION OF THE DRAWINGS

FIG. 10C is a flowchart illustrating another method of calibrating drive voltages for driving a display element including adjusting a drive voltage based on identifying an error condition when driving the display element.

DETAILED DESCRIPTION

The following detailed description is directed to certain specific embodiments. However, other embodiments may be used and some elements can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Methods and systems for electrical sensing, measurement and characterization of display elements are described. An embodiment includes integrating the electrical sensing, measurement and characterization with the display drive scheme. This embodiment allows for measurement of DC or operational hysteresis voltages and/or response times of interferometric modulator MEMS devices, for example, to be fully integrated with the display driver IC and/or the display drive scheme. Another embodiment allows these measurements to be performed and used without resulting in display artifacts visible to a human user. Another embodiment allows the measurement circuitry to be integrated with the display driver IC and/or the display drive scheme re-using several existing circuitry components and features, thus allowing for integration of the measurement method and its use relatively easily.

Figure 1:
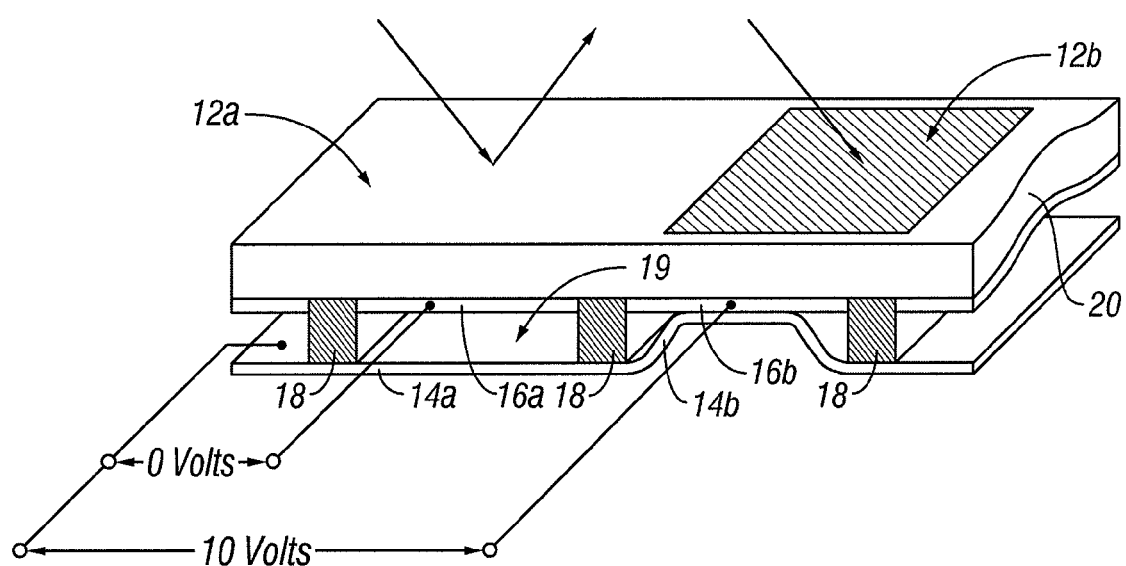
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
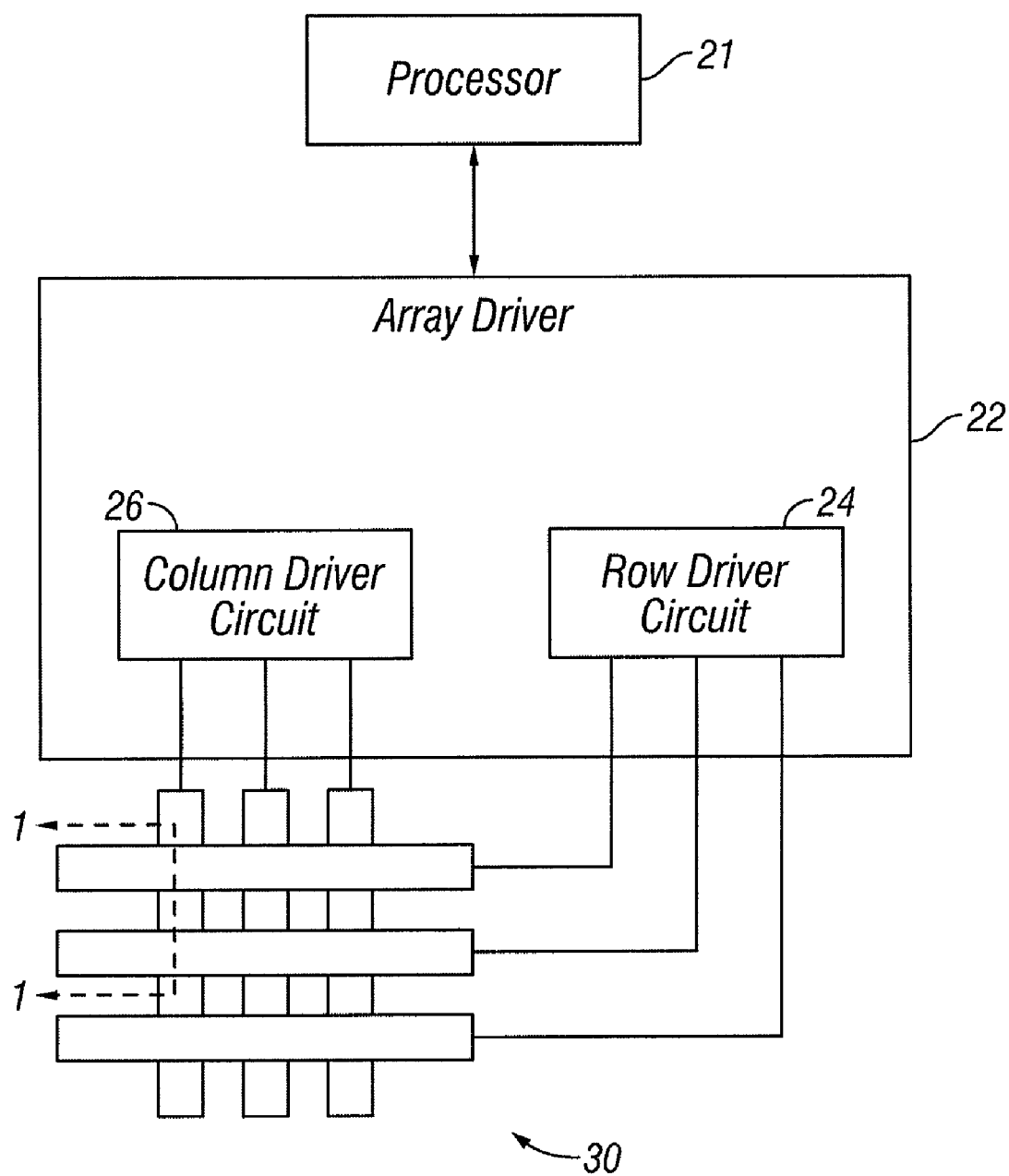
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
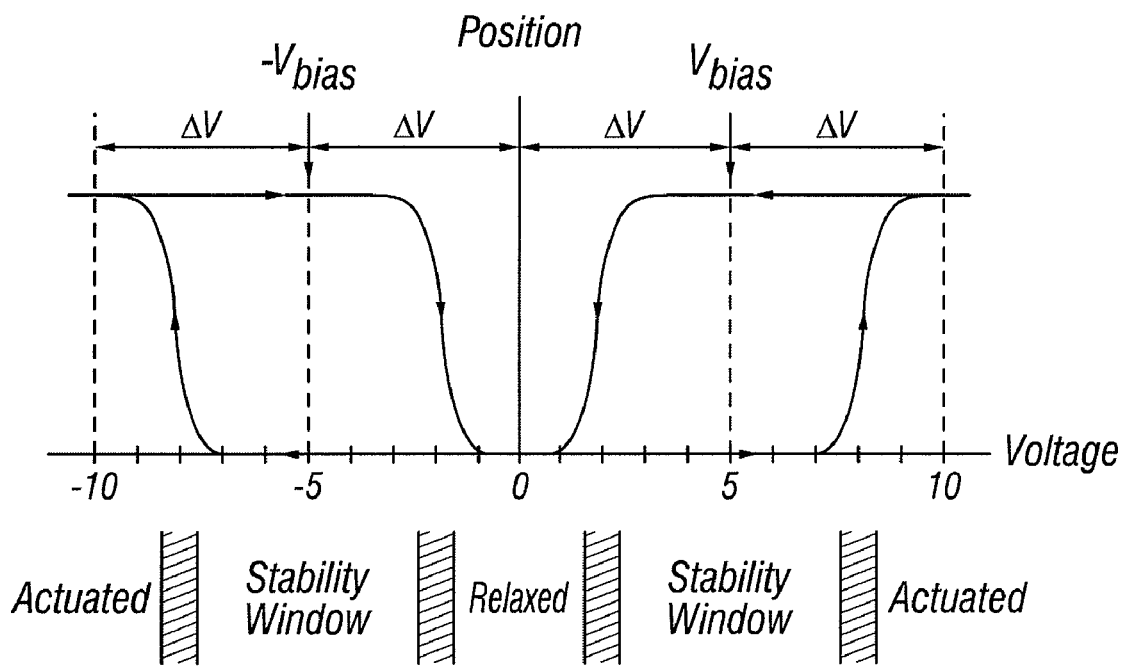
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
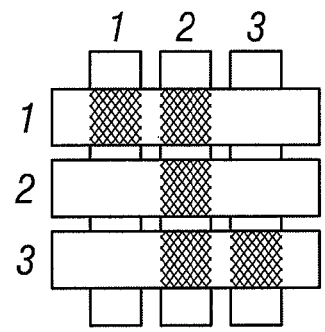
FIG. 5A illustrates one exemplary frame of display data in the 3×3 interferometric modulator display of FIG. 2.
Figure 5B:
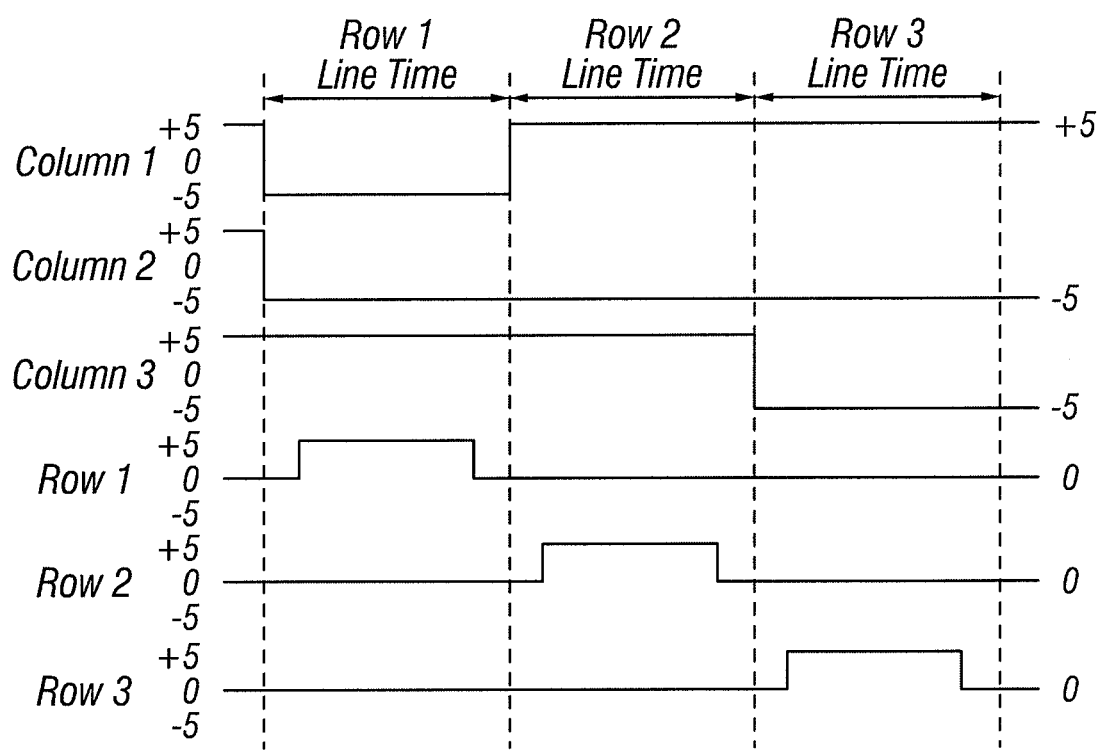
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
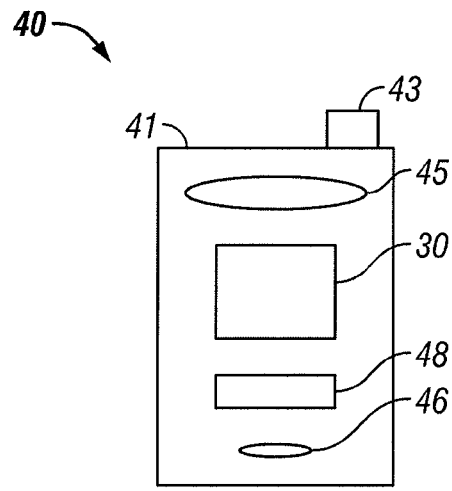
FIGS. 6A and 6B are system block diagrams illustrating an embodiment of a visual display device comprising a plurality of interferometric modulators.
Figure 6B:
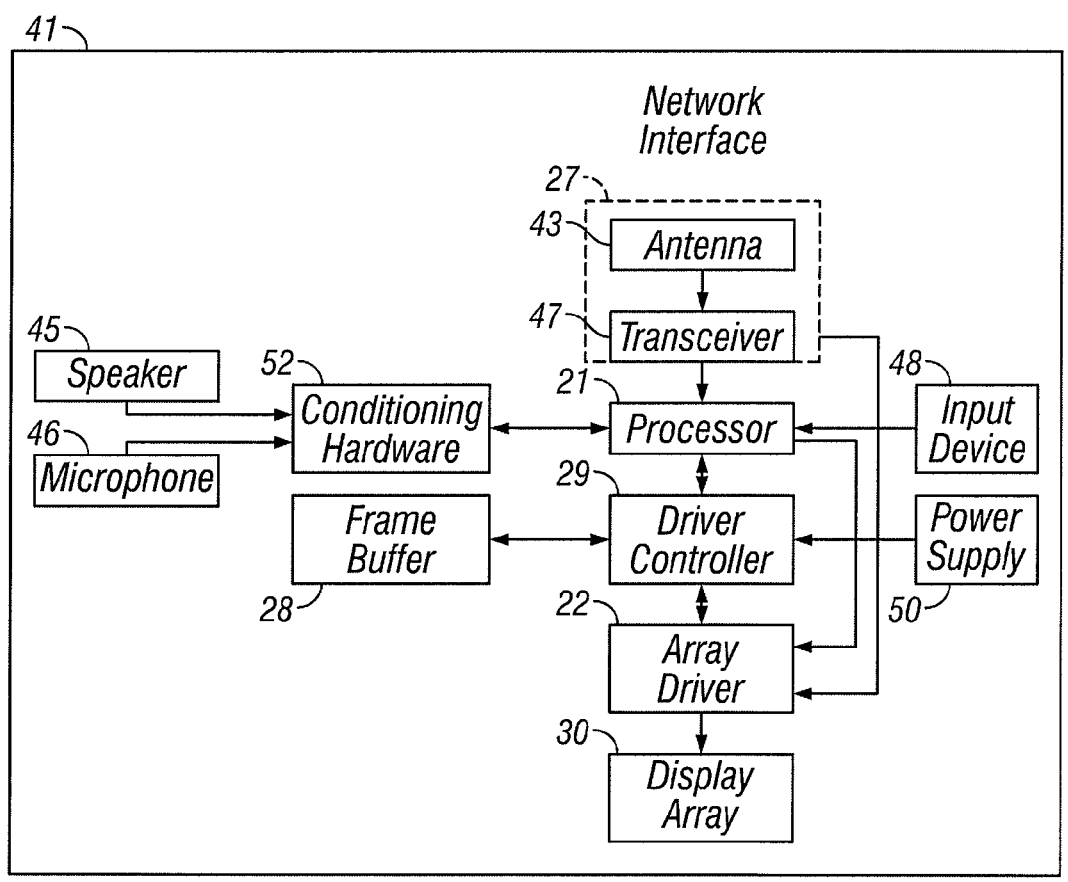

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
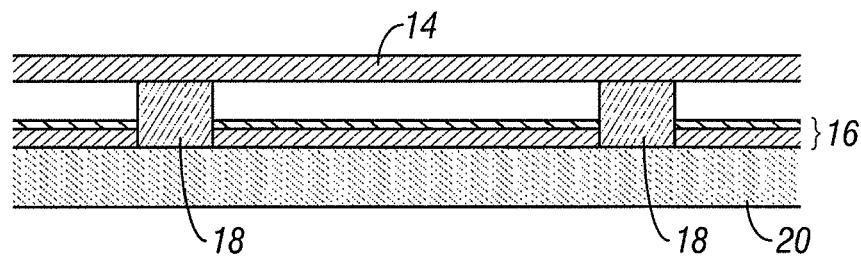
FIG. 7A is a cross section of the device of FIG. 1.
Figure 7B:
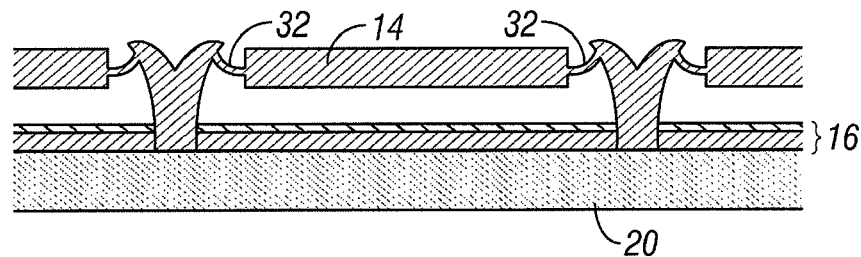
FIG. 7B is a cross section of an alternative embodiment of an interferometric modulator.
Figure 7C:
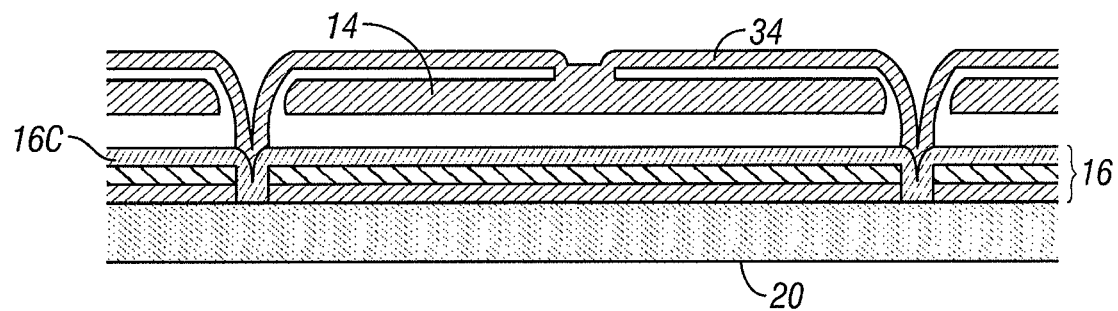
FIG. 7C is a cross section of another alternative embodiment of an interferometric modulator.
Figure 7D:
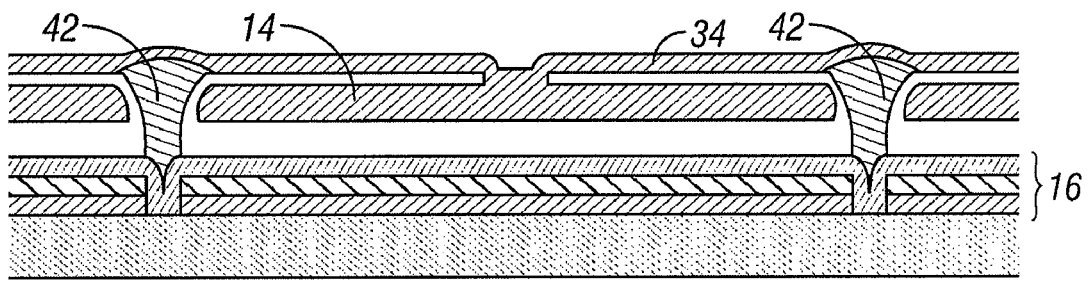
FIG. 7D is a cross section of yet another alternative embodiment of an interferometric modulator.
Figure 7E:
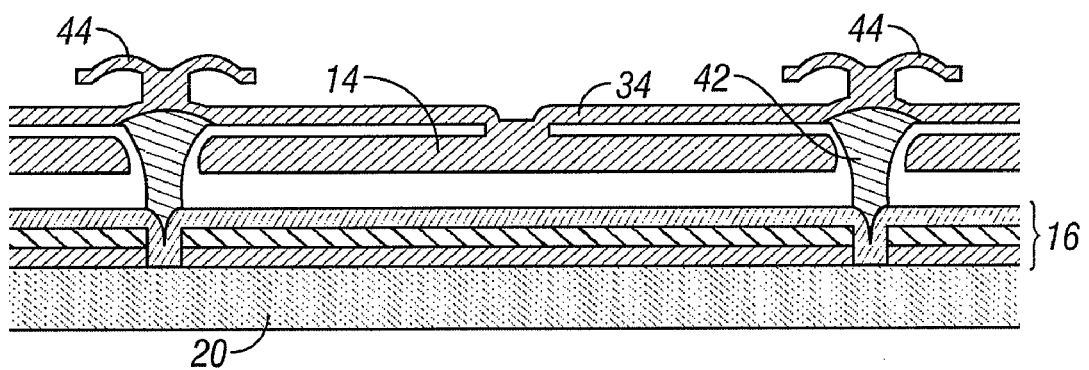
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The following description is directed to methods and devices used to provide, monitor and adapt drive voltages of a wide variety of MEMS elements, such as MEMS switches, and other elements having deflected or deformed electrodes and/or mirrors. Although the specific examples discussed use interferometric modulators as the elements, the principles discussed may apply to other MEMS elements as well.

Display devices like those based on interferometric modulator technology may be measured and characterized electronically and/or mechanically. Depending on the display technology, these measurements can form a part of calibration of the display module (the display "module" referred to herein includes the display panel, the display driver, and associated components such as cabling, etc.), and the measurement parameters may be stored into a non-volatile memory (e.g., NVRAM) in the display module for future use. As discussed above with reference to FIG. 3, the interferometric modulators operate based on a potential difference applied to them. FIG. 3 shows that the interferometric modulators are in either the relaxed (or released) state or in the actuated state, depending on the magnitude of the potential difference applied between their electrodes. As shown, the changing of one state to another happens according to a hysteretic characteristic with a stability (or hold) window, where the device holds its current state when the applied potential difference falls within the hold window. As used herein, a "bias voltage" refers to a potential difference that falls within the hold window. Accordingly, as shown in FIG. 3, there are five input voltage difference ranges in some embodiments. Each of the five voltage difference ranges has a title reflecting its effect on the state of the interferometric modulator. Starting from the left of FIG. 3, the five voltage difference ranges are: 1) negative actuate ("Actuated"); 2) negative hold ("Stability Window"); 3) release ("Relaxed"); 4) positive hold ("Stability Window"); and 5) positive actuate ("Actuated").

Based on theoretical understanding of the devices and past experimental results, approximate values of the thresholds between these input voltage difference ranges may be known, but in order to more optimally operate the interferometric modulator array, the threshold voltages can be measured with more precision. For example, as described further herein, the thresholds may vary from device to device, lot to lot, over temperature, and/or as the device ages. Threshold values may accordingly be measured for each manufactured device or group of devices. One method of measuring the threshold voltages is to apply inputs of various voltage differences while monitoring the state of the interferometric modulators through observation of the optical characteristics of the interferometric modulators. This may be accomplished, for example, through human observation or by use of an optical measurement device. Additionally or alternatively, the state of the interferometric modulators may be monitored through electronic response measurement. In some embodiments, the array driver 22 of the display array 30, discussed above, may be configured to measure electrical responses of display elements in order to determine the state and/or operational characteristics of the display elements according to the methods discussed below.

Often times, the behavior of a display device changes with the age of the display device, with variations in temperature of the display, with the content of the images being displayed, etc. Display devices may have one or more electrical parameters that change in relation to the optical response or optical state. As discussed above, the interferometric modulator is set to an actuated state when the electrostatic attraction between the reflective layer and the optical stack is great enough to overcome the mechanical restorative forces working to hold the reflective layer in the relaxed state. Because the reflective layer, the optical stack, and the gap between them form two conductive plates separated by a dielectric, the structure has a capacitance. Also, because the capacitance of the structure varies according to the distance between the two plates, the capacitance of the structure varies according to the state of the interferometric modulator. Therefore, an indication of the capacitance can be used to determine the state of the interferometric modulator.

In one aspect, an indication of the capacitance can be obtained, for example, by sensing the current or charge used to change the voltage applied between the reflective layer and the optical stack. A relatively high amount of current or charge indicates that the capacitance is relatively large. Similarly, a relatively low amount of current or charge indicates that the capacitance is relatively small. The sensing of current or charge may be accomplished, for example through analog or digital integration of a signal representing the charge or current.

Similar characteristics can apply to LCD display technology where the capacitance of the device is related to the resulting optical brightness of the cell at a certain temperature. In addition to the operational characteristics of display element possibly changing with age, the operational characteristics can be affected by the temperature of the display elements. The temperature of a display element can depend on the past optical response states that were displayed, and, thus, the operational characteristics could vary independently for each display element in the display array of the display device.

In one embodiment, the relevant characteristics of the display device, like hysteresis voltages and response times for interferometric modulator MEMS devices and brightness-voltage relationship for LCD devices, are measured after manufacturing at the factory during a calibration procedure. This information can then be stored in a memory the display module used for driving the display device. Since the characteristics of the display device may also change with temperature and aging, for example, the effects of temperature and aging on these characteristics (e.g., temperature coefficient) may be studied, measured and also hardwired or stored in the memory of the display module. In spite of this post-manufacturing characterization, however, the calibration margins built into the display device may not allow for unpredictable changes in the characteristics of the display device. In some cases, the lifetime and quality of a display device may be improved by performing recalibration of the device after a certain period of use (e.g., one year), on a random length periodic basis, based on changes in temperature, etc. In other cases, the drive scheme may be robust enough to compensate for changes in characteristics of the display device without such recalibration. Examples of such recalibration and robust drive schemes are discussed below.

Figure 8:
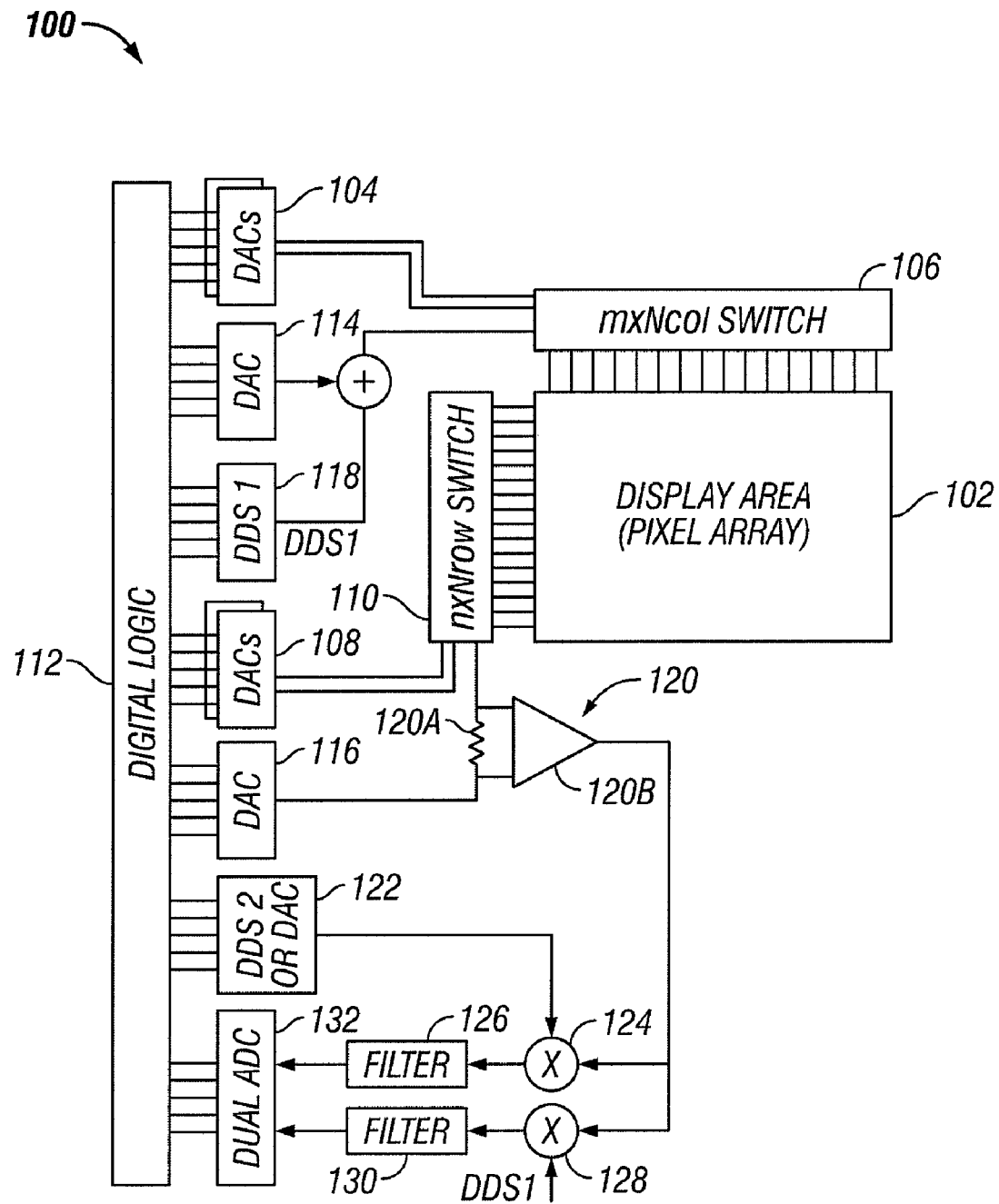
FIG. 8 is a block diagram illustrating an example system configured to drive a display array and measure an electrical response of selected display elements, such as the interferometric modulator display device of FIG. 2.

FIG. 8 is a block diagram illustrating an example system 100 configured to drive a display array 102 and measure an electrical response of selected display elements, such as the interferometric modulators 12a and 12b of FIG. 1. The display array 102 comprises m columns by n rows of N-component pixels (e.g., N may be 3 display elements including red, green and blue, for example). The system 100 further includes a column driver comprising 2 or more digital to analog converters (DACs) 104 for supplying two or more drive voltage levels as well as a column switch subsystem 106 for selecting the columns to which data signals are supplied. The system 100 further includes a row driver circuit comprising two or more DACs 108 for supplying two or more drive voltage levels as well as a row switch circuit 110 for selecting which row to strobe. Note that the row and column drivers that are directly connected to the display array in this schematic are shown as composed of switches, but several methods discussed below are applicable to alternative driver designs including a full analog display driver. Note that while drive voltages are discussed herein, other drive signals, such as drive currents or drive charges may be used.

The row and column driver circuitry including the DACs 104 and 108 and the switches 106 and 110 are controlled by digital logic of an array driver 112. As discussed above in reference to FIGS. 2 and 3, the row/column actuation protocol contained in the digital logic of the array driver 112 may take advantage of a hysteresis property of interferometric modulator MEMS devices. For example, in a display array comprising interferometric modulators 12 having the hysteresis characteristics of FIG. 3, the row/column actuation protocol can be designed such that during row strobing, display elements in the strobed row that are to be actuated are exposed to an actuation voltage difference (e.g., about 10 volts), and display elements that are to be relaxed are exposed to a voltage difference of close to zero volts, as shown in FIGS. 4 to 5. After the strobe, the display elements are exposed to a steady state voltage difference known as the bias voltage (e.g., about 5 volts) such that they remain in whatever state the row strobe last put them. After being written, each display element sees a potential difference within the "stability window" of 3-7 volts in this example. However, as discussed above, the characteristics of the display elements may change with time and/or temperature or may respond more quickly or slowly to different drive voltage levels. As such, the array driver 112 and the DACs 104 and 108 may be configured to supply variable voltage levels, depending on the embodiment.

In addition to the drive circuitry discussed above (including the DACs 104 and 108 and the switches 106 and 110, and the array driver 112), the remaining blocks of the system 100 are able to apply further electrical stimulus to selected display elements, as well as to be able to measure the electrical response of selected display elements in the display array 102. In this example, digital-to-analog converters (DACs) 114 and 116 supply additional voltages to the display array 102 via the column and row switches 106 and 110, respectively. In general, these may represent internal or external voltage supply inputs to the row and column drive circuitry.

In this example, a direct-digital-synthesis (DDS1) block 118 is used to generate the electrical voltage stimulus that is added on the top of the voltage level produced by the DAC 114 connected to the column switch 106. The stimulus signal produced by the DDS1 block 118 may be produced by several alternative means such as an electrical oscillator, a saw-tooth waveform generator, etc. which are familiar to those skilled in the art. In various embodiments, the stimulus may be current or charge, or even a controlled output impedance.

In the example shown in FIG. 8, the electrical response of the display array 102 is measured in the form of electrical current flowing through the display array 102 resulting from application of the electrical voltage stimulus to the row and/or column electrodes via the row and/or column switches 106 and 110, respectively. Other forms of measured electrical response can include voltage variations, etc. A trans-impedance amplifier 120 (shown in FIG. 8 as a resistor 120A followed by an amplifier 120B) may be used to measure the electrical response. The display element(s) for which the measured electrical response corresponds depends on the states of the column and row switches 106 and 110. In alternative embodiments, analog, digital, or mixed-signal processing may be used for the purpose of measurement of the electrical response of the display array 102.

In one embodiment, the electrical response of a display element is measured directly by measuring the current through the input terminals of the trans-impedance amplifier 120. In this embodiment, the profile and/or peak values, or other characteristics known to skilled technologists, can be used to identify certain operational characteristics of the display element.

In another embodiment, operational characteristics of the display element being measured can be characterized by additional post processing of the electrical response output from the trans-impedance amplifier 120. An example of using post processing techniques to characterize the capacitance and the resistive component of the impedance of an interferometric modulator using the circuitry of FIG. 8 is now discussed.

Since an interferometric modulator can be considered a capacitor, a periodic stimulus, such as that which could be applied using the DDS1 118, will result in a periodic output electrical response with a 90° phase lag. For example, the DDS1 118 could apply a sinusoidal voltage waveform, sin (wt), to the column electrode of the display element. For an ideal capacitor, the electrical response of the display element would be a time derivative of the applied stimulus, or cos(wt). Thus, the output of the trans-impedance amplifier 120 would also be a cosine function. A second DDS, DDS2 122, applies a cosine voltage waveform that is multiplied by the output of the trans-impedance amplifier 120 at multiplier 124. The result is a waveform with a constant component and a periodic component. The constant component of the output of the multiplier 124 is proportional to the capacitance of the display element. A filter 126 is used to filter out the periodic component and result in an electrical signal that is used to characterize the capacitance, and therefore the actuated or unactuated state, of the display element.

For a display element that is an ideal capacitor, the output of the trans-impedance amplifier 120 is a pure cosine function for the example where the applied stimulus is a sine function. However, if the display element exhibits any non-capacitive impedance, due to leakage for example, the output of the trans-impedance amplifier 120 will also contain a sine component. This sine component does not affect the measurement of the capacitance, since it will be filtered out by the filter 126. The sine component can be detected and used to characterize the resistive portion of the impedance of the display element.

A periodic voltage waveform similar to the stimulus applied by the DDS1, sin (wt) for example, is multiplied by the output of the trans-impedance amplifier 120 at a multiplier 128. The result is an electrical response that includes a constant component and a periodic component. The constant component is proportional to the resistive portion of the impedance of the display element being measured. A filter 130 is used to remove the periodic component resulting in a signal that can be used to characterize the resistive portion of the impedance of the display element.

The outputs of the filters are converted to the digital domain by use of a dual analog to digital converter (ADC) 132. The output of the dual ADC 132 is received by the array driver 112 for use in carrying out the methods discussed below.

Figure 9:
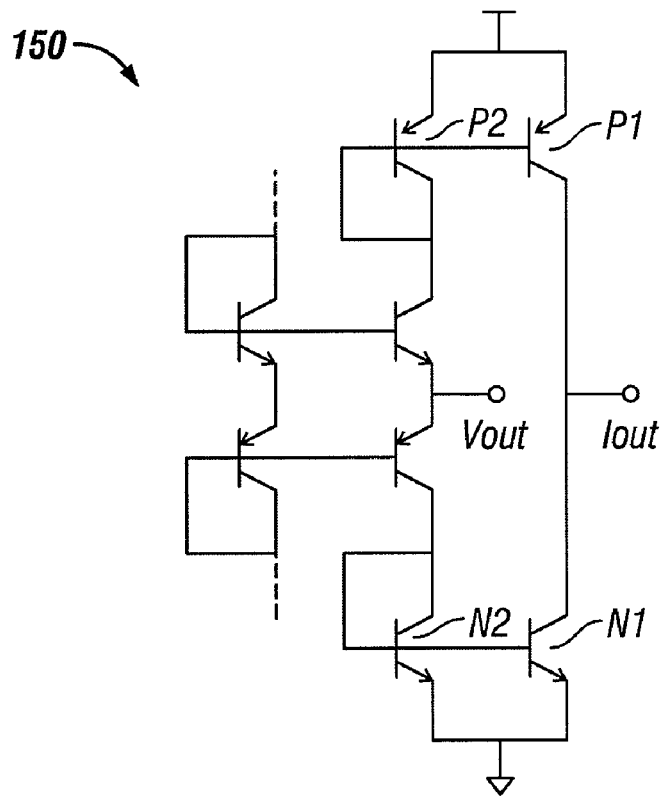
FIG. 9 is a block diagram illustrating another example of circuitry that can be used to measure an electrical response of selected display elements via the same circuitry used to apply a stimulus to the selected display elements, such as in the interferometric modulator display device of FIG. 2.

In the example circuitry shown in FIG. 8, the characterization stimulus is applied to a column electrode and the electrical response is measured via a row electrode. In other embodiments, the electrical response can be measured from the same electrode, row or column, for example, to which the stimulus is applied. FIG. 9 is a block diagram illustrating an example of circuitry 150 that can be used to measure an electrical response of selected display elements via the same circuitry used to apply a stimulus to the selected display elements, such as in the interferometric modulator display device of FIG. 2. The circuit 150 comprises transistors N1 and P1 which mirror the current from the current source transistors N2 and P2 used to drive the $V_{out}$ signal applied to the display element. Accordingly, the current $I_{out}$ is substantially equal to the current used for driving the $V_{out}$ signal. Measuring the electrical response of the $I_{out}$ signal may, therefore, be used to determine operational characteristics of the interferometric modulators such as whether the interferometric modulators are in a high or low capacitance state. Other circuits may also be used. The circuit 150 shown in FIG. 9 is applicable to alternative driver IC designs or drive schemes for supplying a voltage waveform $V_{out}$. The circuit 150 depicted in the schematic of FIG. 9 can be used in current conveyor circuits and in current feedback amplifiers, and can apply an electrical voltage stimulus to the display array area and simultaneously replicate the current (response) to a different pin ($I_{out}$) for purposes of electrical sensing.

There are several ways in which measured electrical responses, such as those sensed by the systems shown in FIGS. 8 and 9, can be used as a feedback signal to affect the operation of the display driver circuitry. For example, the measured information may be analyzed in the digital domain, e.g., using the digital logic of array driver 112 and/or a processor configured to control the array driver 112 (e.g., the processor 21 and array driver 22 shown in FIG. 2) and then used to adaptively drive the display array 102. The measured electrical responses may also be used to complete a feedback loop in the analog domain (e.g., using the outputs of the DACs 104, 114, 108 and/or 116, or using the output of the DDS1 118 shown in FIG. 8). Examples of methods of driving interferometric modulator display elements using measured electrical responses as feedback are illustrated in FIGS. 10A-10C.

Figure 10A:
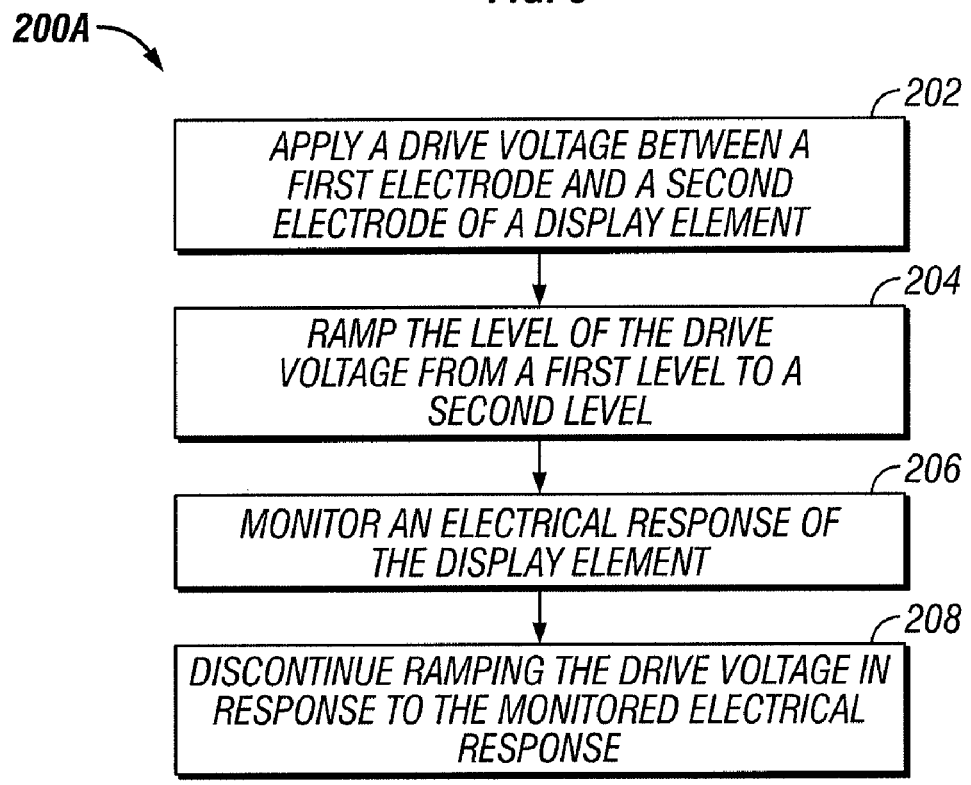
FIG. 10A is a flowchart illustrating an example of a method of driving a display element, such as, for example, the interferometric modulator as illustrated in FIG. 1, where a ramped drive voltage is used.
Figure 10B:
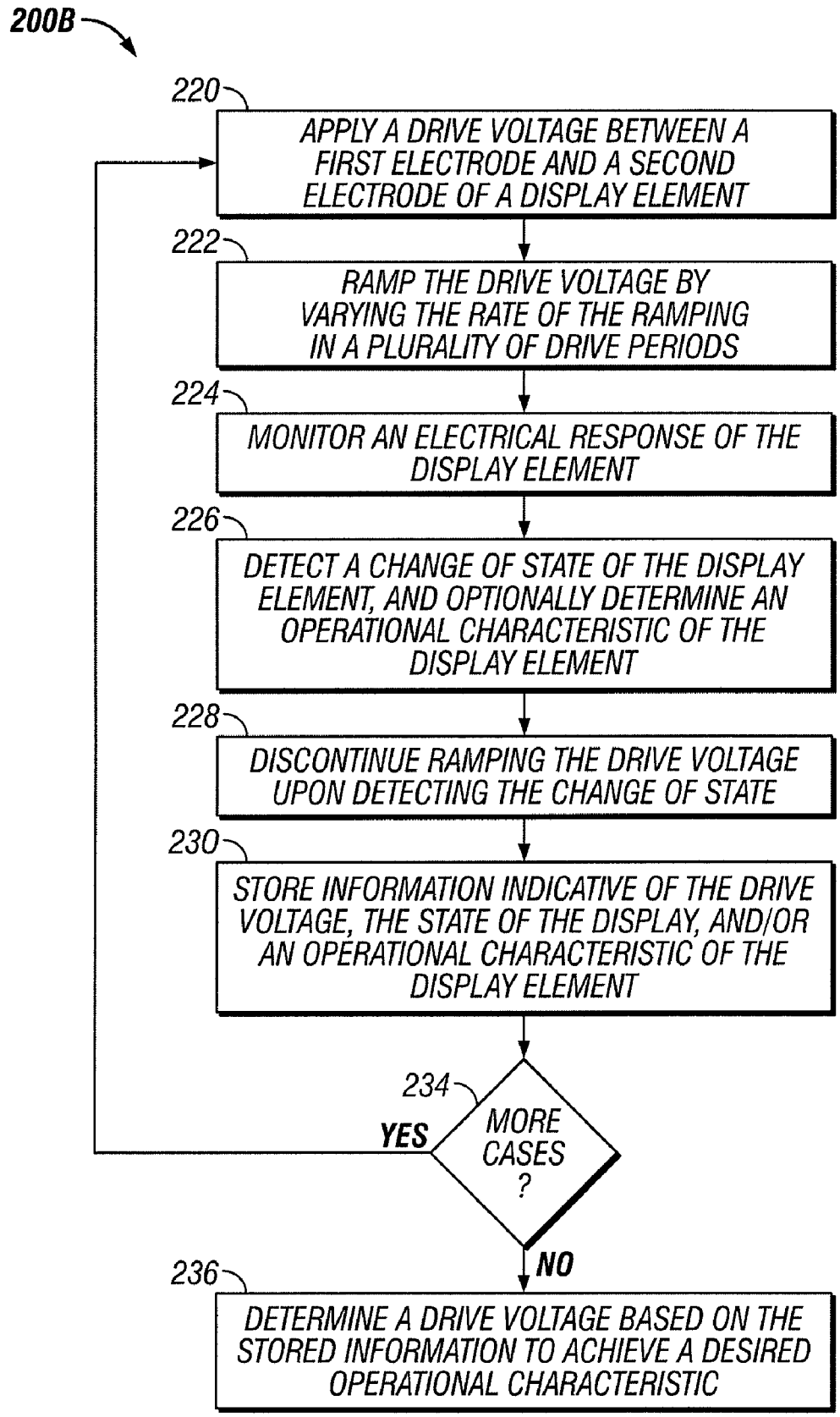
FIG. 10B is a flowchart illustrating a method of calibrating drive voltages for driving a display element including determining a drive voltage based on a desired operational characteristic of the display element.

FIG. 10A is a flowchart illustrating an example of a method 200A of driving a display element, such as, for example, the interferometric modulator as illustrated in FIG. 1, where a ramped drive voltage is used. In one embodiment, the method 200A can be performed by the array driver 112 for controlling the drive circuitry (e.g., the DACs 104, 108 and 114, the switches 106 and 110, and the DDS1 118) shown in FIG. 8 to display images on the display array 102. In other embodiments, a processor such as the processor 21 in FIG. 2, can perform the method 200A. The method 200A provides a method of adapting drive voltage levels by applying a gradually increasing or decreasing voltage waveform to a display element and discontinuing the application of the voltage waveform when a change in state of the display element is sensed. In this way, the applied voltages, including drive voltages to actuate or release the display element, can be changed only as much as necessary, thereby conserving power.

The method 200A starts at block 202 where the array driver 112 applies a drive voltage between a first electrode and a second electrode of a display element. The first electrode may be one of the movable reflective layers (column electrodes) 14 and the second electrode may be one of the row electrodes 16 of the interferometric modulators 12 illustrated in FIG. 1. The drive voltage applied at block 202 may be a voltage at the bias voltage within the hysteresis window (e.g., 3-7 volts as discussed above), or, alternatively may be a static voltage level outside of the hysteresis window. As used herein, a static voltage is a voltage that is non-varying over time, such as over an actuation period. The static drive voltage difference applied to the two electrodes at block 202 may be supplied by one or more of the DACs 104 or 108 (FIG. 8) to the column and/or row electrodes, respectively.

Figure 11A:
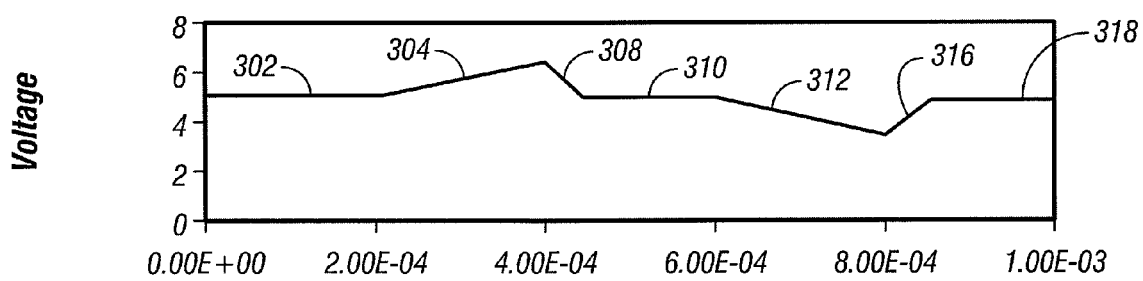
FIG. 11A is an illustration of an example of a ramped voltage waveform for driving a display element.

After the initial drive voltage is applied at the block 202, the method 200A continues at block 204, where the array driver 112 ramps the level of the drive voltage from a first level (e.g., the static voltage level applied at block 202) to a second level. FIG. 11A is an illustration of an example of a ramped voltage waveform for driving a display element that may be used in the method 200A. In FIG. 11A, the initial drive voltage applied at the block 202 is a 5 volt bias voltage 302 (the static voltage applied in block 202). At approximately 2 ms, a ramped voltage waveform 304 is applied at block 204 in the method 200A. The ramped voltage waveform 304 continues to be increased until a measured electrical response, as sensed by electrical sensing feedback circuitry such as the trans-impedance amplifier 120 in FIG. 8, monitors an electrical response of the display element at block 206. For example, the trans-impedance amplifier 120 may sense a change in the current to or from the display element, indicating a change in state of the display element.

Figure 11B:
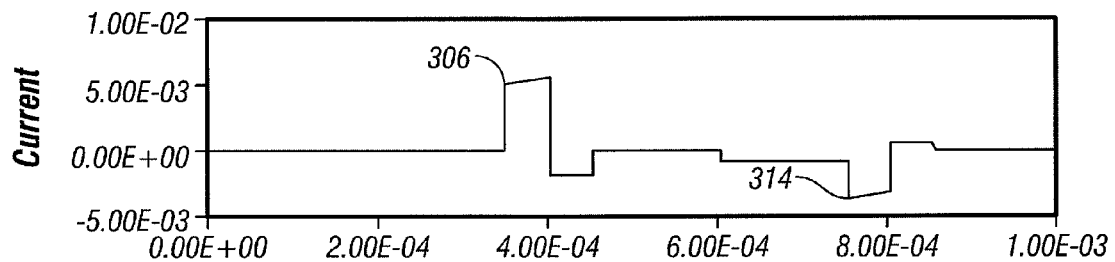
FIG. 11B is an illustration of a sensed electrical response of drive circuitry connected to the display element that may be used in the methods illustrated in FIGS. 10A and 10B.

In this example, the monitored electrical response is indicative of a change of state of the interferometric modulators 12 of FIG. 1. FIG. 11B is an illustration of a sensed electrical response that may be sensed with the electrical sensing feedback circuitry connected to the drive circuitry of the display element using the method 200A illustrated in FIG. 10A. At about 4 ms, the sensed electrical current shows a sharp rise 306 to a level of about +5 milliamps. The sensitivity of the amplifier to the sensed electrical current can depend on the resistance of the circuitry being used for sensing. For example, in an embodiment such as that shown in FIG. 8, the resistance of the resistor 120A may be chosen to result in a output amplitude that is easily measurable, depending on the feedback circuitry. Upon detecting the rise 306 in the sensed current in block 206, the method 200A continues to block 208, where the ramped voltage waveform is discontinued as shown at 308 in FIG. 11A and reduced to the static (bias) voltage level of 5 volts at 310 to allow the interferometric modulator to remain in the actuated state. In the example shown in FIG. 11A, the ramped voltage results in actuation of the display element at about 6 volts. This is merely an example actuation level and other levels of voltage may result in actuation, depending on the design of the display element.

Although described above with respect to an actuation signal, a release signal can also be applied by the array driver 112 at the block 202 of the method 200A. For example, as shown in FIG. 11A at about 6 ms, a release procedure is initiated and a ramped voltage waveform 312 is applied. The ramped voltage 312, applied at the block 204 of method 200A reduces the drive voltage from the initial 5 volts (that was applied at the block 202) to about 4 volts. When the ramped voltage waveform reaches about 4 volts, interferometric modulator 12 releases and the electrical sensing circuitry measures a sharp decline 314 in the sensed current (sensed at the block 206) to a level of about −3 milliamps, indicating that the display element has released. Upon sensing the decline in current at 314 due to the change in IMOD state, the method 200A continues to block 208, where the ramped drive voltage waveform is discontinued and the drive voltage is reduced (see 316) to the 5 volt bias voltage level at 318 such that the display element remains in the released state. Once again, the voltage and current levels shown in FIG. 11 are exemplary only, and other levels may be indicative of actuation and or release of a display element. The ramped voltage waveform applied at the block 204 may be applied using the DDS1 118 illustrated in FIG. 8.

In some embodiments, the rate of increase or decrease of the ramped voltage waveform is at a predetermined rate that is slow relative to the response time of the display element when an actuation and/or release event occurs. In this way, the change in voltage levels from the bias level to the actuation and/or release voltage levels can be minimized. In another embodiment, the rate of increase and/or decrease in the ramped voltage waveform is calibrated and chosen in order to achieve a desired operational characteristic of the display element, such as, for example response time.

FIG. 10B is a flowchart illustrating a method 200B of calibrating drive voltages for driving a display element. In one embodiment, the method 200B can be used to determine an operational threshold drive voltage based on a desired operational characteristic of the display element, e.g., response time. The method 200B includes a calibration portion, blocks 220 to 234, which, in one embodiment, can be performed at the time of manufacture of the display element for initial calibration. In this embodiment, the process 200B can be performed by an external processor connected to the display array, such as a test stand, for example.

In another embodiment, the calibration blocks 220 to 234 can also be included in logic coupled to the display array so that the calibration can be performed at other times in order to recalibrate the display element. For example, the recalibration may be done on a periodic basis based on the age of the display element, on a pseudo-random basis, based on temperature, etc. In this embodiment, the method 200B can be performed using the array driver 112 for controlling the drive circuitry (e.g., the DACs 104, 108 and 114, the switches 106 and 110, and the DDS1 118) shown in FIG. 8 to display images on the display array 102. In other embodiments, a processor such as the processor 21 in FIG. 2 can perform the method 200A. After calibration, the array driver 112 may determine a drive voltage (e.g., an initial drive voltage level and/or a ramped voltage rate) in order to achieve a desired operational characteristic.

At block 220, the array driver 112 applies a drive voltage between a first electrode and a second electrode of a display element. The first electrode may be one of the movable reflective layers (column electrodes) 14 and the second electrode may be one of the row electrodes 16 of the interferometric modulator illustrated in FIG. 1. The drive voltage applied at block 220 may be a static voltage at a bias voltage level within the hysteresis window (e.g., 3-7 volts as discussed above), or, alternatively may be a static voltage outside of the hysteresis window. By selecting different static voltage levels outside of the hysteresis window, an operational characteristic of the display element in response to a static, i.e., non-ramped, drive voltage may be determined. Operational characteristics that may be affected by the various static drive voltage levels applied at the block 220 include response time, maximum sensed current level, amount of stiction, release voltage level, actuation voltage level, etc. The static drive voltage difference applied to the two electrodes at block 220 may be supplied by one or more of the DACs 104 or 108 to the column and/or row electrodes, respectively.

At block 222, the array driver 112 ramps the level of the drive voltage from a first level, e.g., the static voltage level applied at block 202, to a second level. The rate of increasing or decreasing ramped voltage levels (slope of ramp) may be varied for multiple calibration tests. In this way, the operational characteristic(s) of the display element may be determined for the various ramped voltage rates. Operational characteristics that may be affected by the various ramped voltage rates applied at the block 222 include response time, maximum current level, amount of stiction, release voltage level, actuation voltage level, etc. The ramped voltage waveform applied at the block 222 may be applied using the DDS1 118 illustrated in FIG. 8.

In some embodiments, where the DDS1 118 is faster than the DAC 114, the DDS1 118 is used to supply the variable portion of the signal and the DAC 114 is used to supply the static portion of the signal. In addition in some embodiments, the DDS1 118 may be configured to generate the waveforms autonomously. In some embodiments, a DDS is configured to generate a static voltage, and one or more DACs may be used to generate a variable portion of the signal. In some embodiments, one or more DACs or DDS's may be used to generate either or both of the variable and static portions of the signal.

The method 200B continues at block 224, where the array driver 112 monitors the electrical sensing feedback circuitry (e.g., the trans-impedance amplifier 120) for the electrical response of the display element. The monitoring functions performed at the step 224 are similar to those discussed above in reference to the block 206 of the method 200A. For example, the trans-impedance amplifier 120 may sense a change in the current to or from the display element, indicating a change in state of the display element. At the block 226, the array driver 112 that is receiving the monitored electrical response detects a change of state of the display element. The change of state may be an actuation or a release of the display element. Upon detecting the change of state of the display element at the block 226, the array driver 112 discontinues the ramping of the drive voltage (if a ramped voltage was applied at the block 222) at block 228 and the method 200B continues to the block 230, where information indicative of the drive voltage is stored, e.g., the static voltage level applied at the block 220 and/or the ramped voltage rate applied at the block 222. In addition, at the block 230, the array driver 112 stores information indicative of the change of state of the display element and optionally an operational characteristic of the display element.

Figure 12:
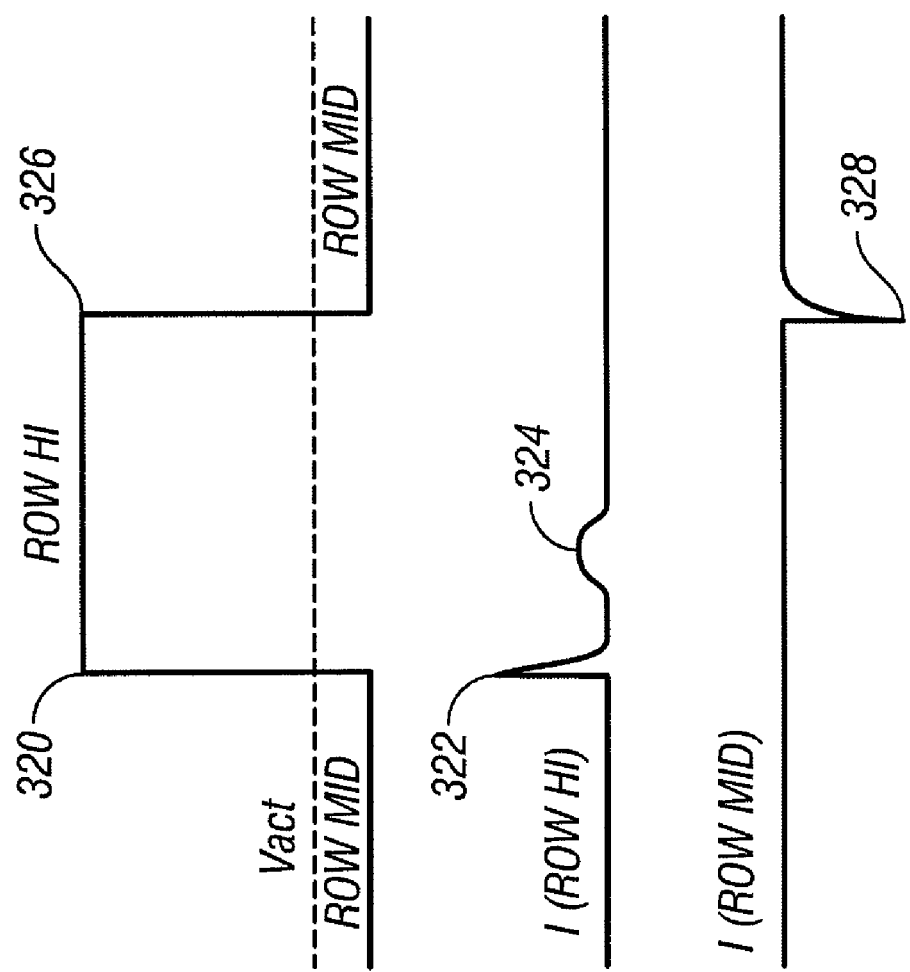
FIG. 12 illustrates an example of a drive voltage waveform for driving a display element and a corresponding electrical response sensed in drive circuitry connected to the display element, such as may be used in the methods illustrated in FIGS. 10A and 10B.

The remaining blocks of FIG. 10B are discussed in reference to FIG. 12. In one embodiment, a response time of the display element is monitored. FIG. 12 illustrates an example of a drive voltage waveform for driving a display element and the corresponding electrical response sensed in drive circuitry (e.g., the row and/or column electrodes in the row or column switches 110 and 106) connected to the display element, such as may be used in the methods illustrated in FIGS. 10A and 10B. The example of FIG. 12 shows the drive voltage transitioning from a bias voltage level where the display element is stable, e.g. in a released state. At time 320, a static drive voltage is applied (e.g., at the block 220 in the method 200A) that results in actuation of the display element. The sensed electrical response, current in this example, exhibits a first current spike 322 indicating that the voltage across the electrodes has changed abruptly, followed by a current "bump" 324 which is indicative of the actuation event. The time between the current spike 322 and the current bump 324 is indicative of the response time (an operational characteristic) of the display element in response to the applied drive voltage. After the current bump 324 is sensed by the electrical sensing circuitry, the drive voltage is discontinued at the block 228 (FIG. 10B) and returned to the bias voltage level at 326. When the drive voltage is reduced to the bias voltage level at 326, the sensed electrical response exhibits another spike 328 indicating that the voltage difference between the electrodes of the display element has been abruptly reduced.

The determination of the response time of the display element is an example of one type of operational characteristic that may be determined at the block 226 (FIG. 10B) and stored in reference to the applied voltage level (the static voltage level and/or the ramped voltage rate) at the block 230. In some embodiments of the display array 202, the response time is reduced at higher or more quickly ramped voltage levels (e.g. where a strong electrostatic attraction causes the movable element to rapidly switch states, where at higher temperatures the spring constant is reduced for the restoring mechanical element, and the like). Other operational characteristics that may be determined and stored in reference to the applied voltage waveforms include maximum sensed current level, amount of stiction, release voltage level, actuation voltage level, etc. At decision block 234, the array driver 112 controlling the calibration method 200B determines if more calibration cases remain to be tested. If more tests remain, the blocks 220 to 234 are repeated for multiple drive periods until no more tests remain and the method 200B proceeds to block 236.

At the block 236, the array driver 112 determines a drive voltage (the static voltage level applied at the block 220 and/or the ramped voltage rate applied at the block 222) based on the information stored at the block 230 to achieve a desired operational characteristic. For example, it may be desired to achieve a response time below a certain time threshold in order to more quickly display an image on a display array comprising the display elements for which the drive voltages and characteristics were calibrated. In another example, it may be desired to keep the peak current level below a certain value in order to keep temperatures below a certain level.

In some embodiments, the methods 200A and 200B may be performed in unison. For example, the functions performed at the block 236 may be performed in conjunction with the method 200A to perform the actuation and release functions of the display element until another calibration process (e.g., the functions at the blocks 220 to 234) is performed at a later time. It should be noted that certain blocks of the methods 200A and 200B may be omitted, combined, rearranged, or combinations thereof.

The methods illustrated in FIGS. 10A and 10B are examples of methods that provide feedback by sensing the electrical response of drive circuitry, for example, where the feedback detects that a display element has been properly actuated or relaxed in response to a given drive voltage. Another embodiment provides feedback that may be used to sense when a display element has not actuated or released properly. Such feedback may be used to adjust the drive voltages to correct the erroneous actuation and/or release states.

FIG. 10C is a flowchart illustrating another method 200C of calibrating drive voltages for driving a display element including adjusting a drive voltage based on identifying an error condition when driving the display element. In one embodiment, the method 200C can be used for calibrating the drive voltages of certain display elements for initial testing during or after manufacture of a display array. This could be done in parallel with the method 200B discussed above. In this embodiment, the process 200C can be performed by an external processor connected to the display array, such as a test stand, for example. In another embodiment, the method 200C can be used for adjusting the drive voltage of display elements during operation upon detecting a failure to actuate a display element while the array driver 112 is driving the display array 102 to display an image. This later embodiment will be discussed in the example shown in FIG. 10C.

The method 200C starts at block 250, where the array driver 112 applies a drive voltage between a first electrode and a second electrode of a display element, wherein the drive voltage is at a level predetermined to result in the display element being in a first of a plurality of display states. The first electrode may be one of the movable reflective layers (column electrodes) 14 and the second electrode may be one of the row electrodes 16 of the interferometric modulators 12 illustrated in FIG. 1, or vice versa. The drive voltage applied at block 250 may be at a level that has been predetermined to result in actuation of a released display element (e.g., a voltage magnitude above the bias voltage range), a level that has been predetermined to result in release of an actuated display element (e.g., a voltage level lower in magnitude that the bias voltage range), or a voltage level that has been predetermined to keep the display element in the current display state (e.g., a voltage magnitude within the bias voltage hysteresis window as discussed above).

As discussed above in reference to FIG. 12, release and/or actuation of a display element can be identified by observing certain electrical response characteristics that can be measured by feedback circuitry. At block 252, the feedback circuitry is used to measure an electrical response of the display element in response to the drive voltage applied by the drive circuitry at the block 250. The feedback circuitry may comprise elements such as the trans-impedance amplifier 120 in FIG. 8. At block 254, a processor receives information indicative of the electrical response measured at the block 252. The array driver 112 analyzes the characteristics of the measured electrical response in order to identify an error in operation of the display element.

Figure 13A:
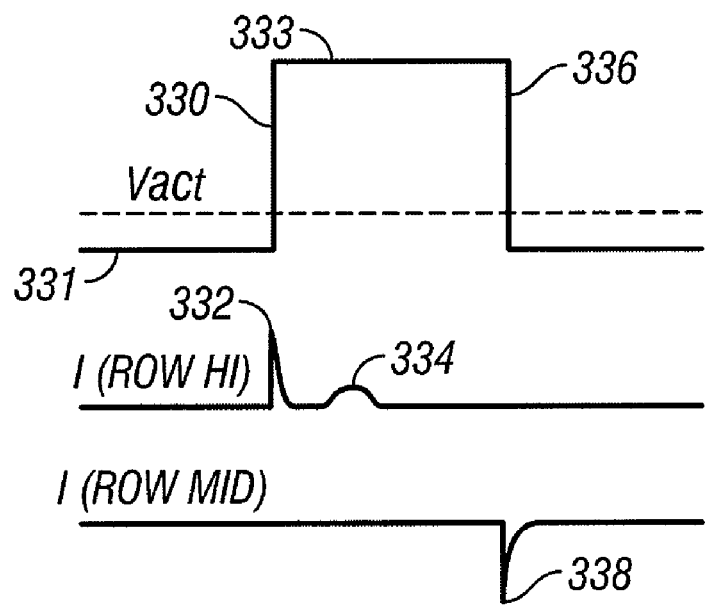
FIG. 13A illustrates an example of a drive voltage waveform and corresponding electrical response indicative of proper actuation of a display element, such as may be used in the method illustrated in FIG. 10C.

An example of a correct actuation and an example of an erroneous actuation of display elements will now be discussed. FIG. 13A illustrates an example of a drive voltage waveform and corresponding electrical responses indicative of proper actuation of an interferometric modulator, such as may be used in the method 200C illustrated in FIG. 10C. In this example, a released interferometric modulator 12 is driven to move from a released state to an actuated state. The initial voltage difference between the two electrodes is at a level 331 that is below the actuation voltage threshold level (e.g., within the bias voltage level) $V_{act}$ in FIG. 13A. At a time point 330, the drive voltage is increased to a level 333 above $V_{act}$. Beginning at the time point 330, the feedback circuitry measurement, current in this example, shows an initial spike 332 followed by a second bump 334. The second bump is indicative that the interferometric modulator 12 has actuated properly. At a second time point 336, the drive voltage is reduced to the level 331 below $V_{act}$ (within the bias voltage region). At the time point 336, a feedback current exhibits a single spike 338. There is no second bump similar to the bump 334 in the feedback current. This lack of a second bump is indicative that the display element properly remained in the actuated state after the time point 336.

Figure 13B:
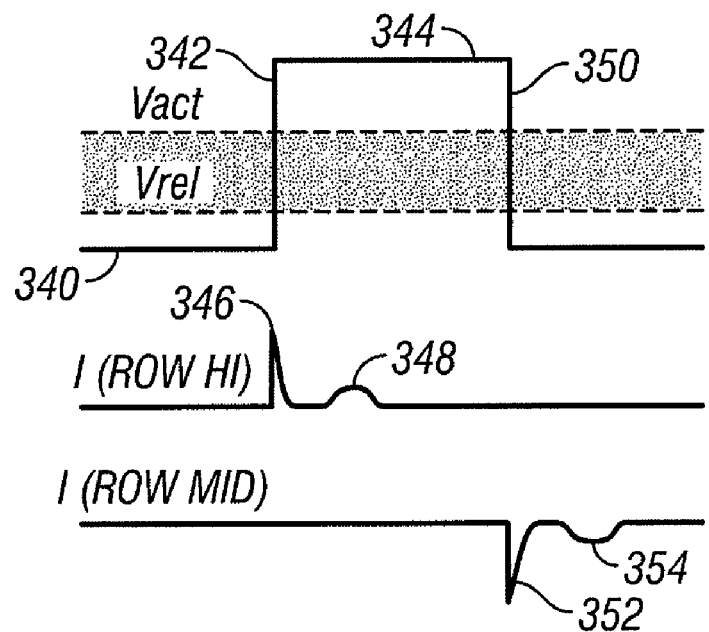
FIG. 13B illustrates an example of a drive voltage waveform and corresponding electrical response indicative of an example of erroneous actuation of a display element, such as may be used in the method illustrated in FIG. 10C.

FIG. 13B illustrates an example of a drive voltage waveform and corresponding electrical responses indicative of an example of erroneous actuation of an interferometric modulator 12, such as may be used in the method illustrated in FIG. 10C. This example is a case where the bias voltage level is incorrectly calibrated at a level that is outside of the bias voltage window. The interferometric modulator 12 may be incorrectly calibrated due to changes in the characteristics of the display element due to age and/or the temperature of the display element, for example.

In this example, the initial voltage between the electrodes is at a level 340 that is below the "bias voltage level", i.e., the level to sustain the interferometric modulator 12 in the current state. At a time point 342, the voltage between the electrodes is increase to a level 344 above the actuation voltage level $V_{act}$ in order to actuate the interferometric modulator 12. The feedback current exhibits a first spike 346 followed by a second bump 348 that is indicative of a proper actuation of the interferometric modulator 12.

At a second time point 350, the voltage between the electrodes is returned to the initial voltage level 340. The feedback current exhibits a first spike 352 followed by a second bump 354. This is indicative that the interferometric modulator 12 has erroneously released due to the voltage being lowered to the level 340 that is outside of the bias voltage window (between the voltage levels $V_{rel}$ and $V_{act}$). By detecting the current bump, the array driver 112 can identify that an error has occurred at block 254 of the method 200C. Subsequent to identifying that an error in operation of the interferometric modulator 12 has occurred, the array driver 112 can adjust the drive voltage at block 256 to be at a level greater than $V_{rel}$ and less than $V_{act}$ thereby resulting in a properly tuned interferometric modulator 12 that remains actuated. The array driver 112 can determine the adjusted drive voltage level using a method such as discussed above in reference to FIG. 10B.

Skilled technologists will readily be able to use similar methods to identify proper actuation voltage thresholds of an interferometric modulator 12. For example, if the interferometric modulator 12 is in the actuated state and the drive voltage applied between the electrodes is supposed to result in releasing the interferometric modulator 12, but the interferometric modulator 12 does not release, then the array driver 112 can adjust the voltage at the block 256 to a lower level until the interferometric modulator 12 properly releases. In another example, if the interferometric modulator 12 is in the released state and the voltage applied at the block 250 is supposed to actuate the interferometric modulator 12, but the interferometric modulator 12 does not actuate, the array driver 112 can adjust the drive voltage to a higher value at the block 256 until the interferometric modulator 12 actuates properly.

In one embodiment, the method 200C includes an optional block 258 where the array driver 112 stores information indicative of the adjusted drive voltage for later use. The adjusted voltage can be stored with information cross-referencing it to a specific interferometric modulator 12. The array driver 112 can then use the adjusted value at a later time when the specific interferometric modulator 12 is being actuated and/or released again. The voltage levels stored at the optional block 258 may include bias voltage levels, release voltage levels and/or actuation voltage levels, depending on the embodiment.

Figure 14:
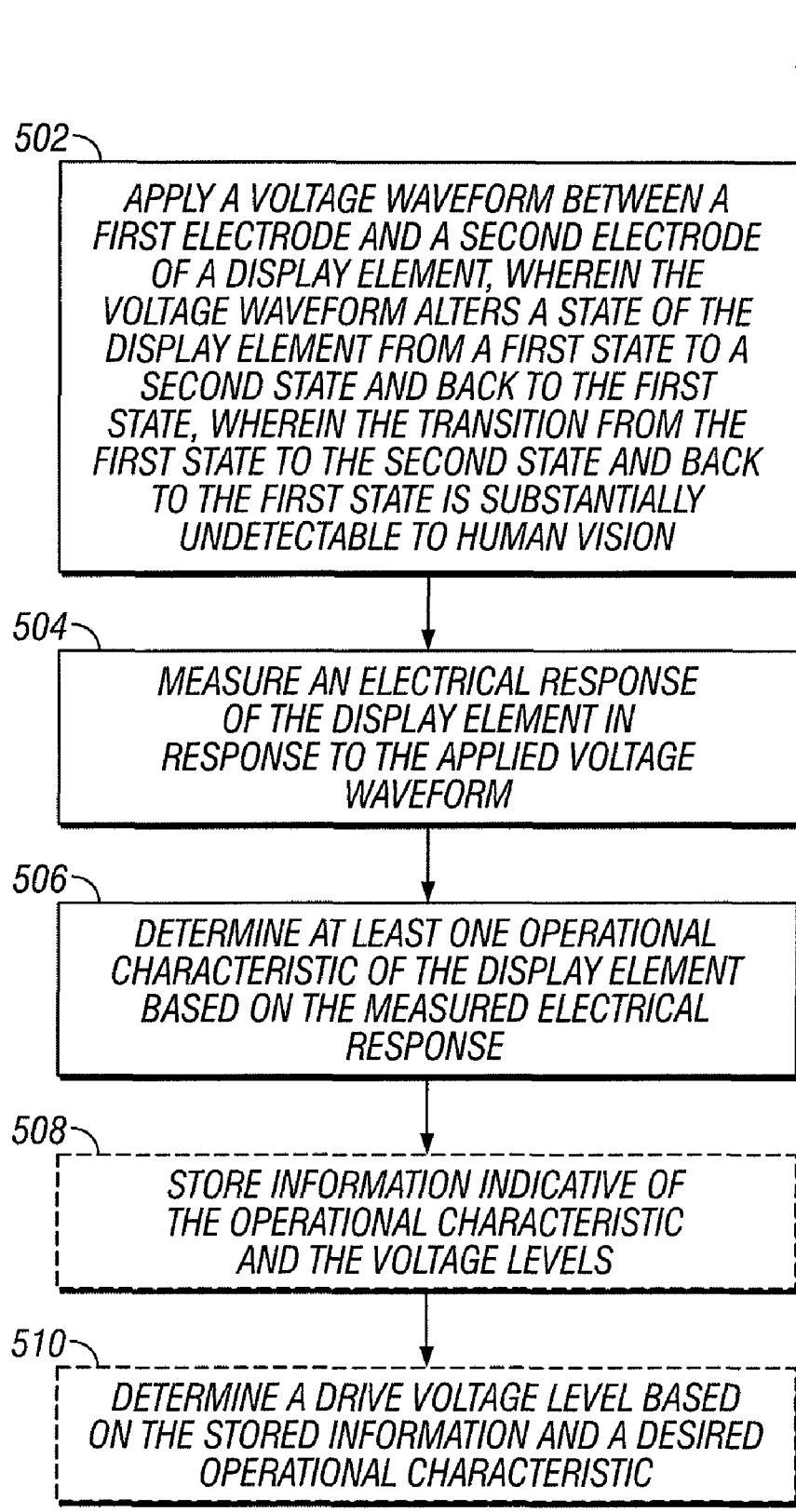
FIG. 14 is a flowchart illustrating a method for driving a display element and measuring an electrical response of the display element to determine a drive voltage to achieve a desired operational characteristic, where the drive voltage results in a display state transition that is substantially undetectable to human vision.

FIG. 14 is a flowchart illustrating an example of a method 500 for driving an interferometric modulator 12 and measuring an electrical response of the interferometric modulator 12 to determine a drive voltage to achieve a desired operational characteristic, where the drive voltage results in a display state transition that is substantially undetectable to human vision. The method 500, in one embodiment, enables drive voltage levels and/or ramped drive voltage rates (as discussed above in reference to the methods 200A and 200B of FIGS. 10A and 10B) to be characterized during operation of the display array 102 in order to adapt to changes in drive voltages quickly. Drive voltage levels may change due to changing conditions such as age and/or temperature of the interferometric modulator 12. The method 500 can be performed by the array driver 112 for controlling the drive circuitry (e.g., the DACs 104, 108 and 114, the switches 106 and 110, and the DDS1 118) shown in FIG. 8 to display images on the display array 102. In other embodiments, a processor such as the processor 21 in FIG. 2 can perform the method 500.

At block 502, the array driver 112 (FIG. 8) applies a voltage waveform between a first electrode and a second electrode of an interferometric modulator 12, where the voltage waveform alters a state of the interferometric modulator 12 from a first state to a second state and back to the first state. The voltage waveform applied at the block 502 results in the interferometric modulator 12 being altered from a released state to an actuated state and back to the released state, or vice-versa. In other words, the optical characteristics of the selected interferometric modulator 12 (or interferometric modulators 12) is momentarily disturbed for the measurement of the electrical response of the interferometric modulator 12, but the interferometric modulator 12 is quickly returned to display the original optical response such that a human observer is not aware of the change of state. As noted above, in some embodiments the interferometric modulator 12 can switch states at ~10 kHz, much faster than human vision can detect. Note that when a new image is "ripped" on the display array (e.g., via a line-at-a-time drive scheme), it is usually desirable that a human user should not be able to perceive the process of one image being overwritten with another. A suitably fast scan rate or rip rate is chosen for this purpose. When the image content is changing anyway, a slight momentary disturbance of the content for the purpose of measurement can be easily masked from a user.

Figure 15:
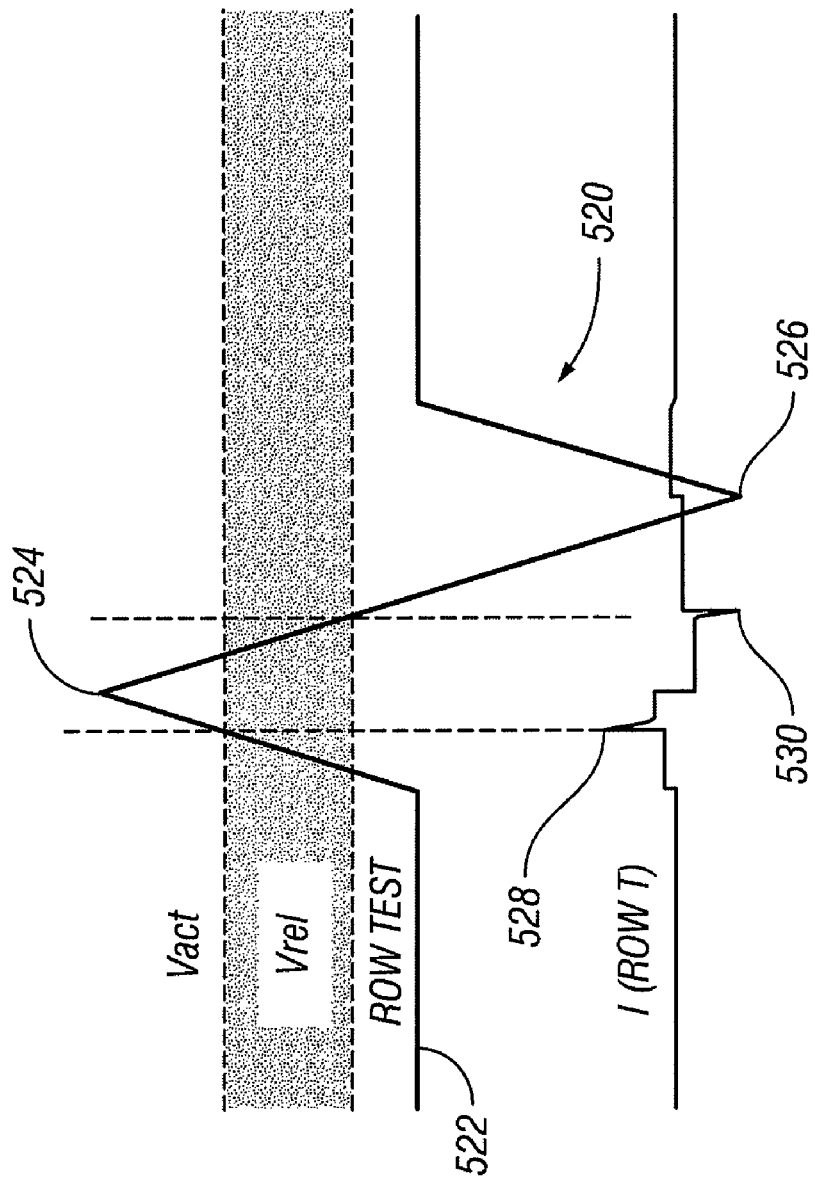
FIG. 15 illustrates an example of a drive voltage waveform and corresponding sensed electrical response that may be used in the method illustrated in FIG. 15.

FIG. 15 illustrates an example of a drive voltage waveform and corresponding sensed electrical response that may be used at the block 502 in the method 500 illustrated in FIG. 15. In this example, a saw-tooth voltage waveform 520 is applied between the electrodes of the display element. In one embodiment, the voltage waveform applied at the block 502 has a duration from start to finish less than about 400 microseconds. However, some embodiments may use voltage wave forms having end-to-end time durations from about 400 microseconds to about 4000 microseconds or larger. The waveform 520 starts with the display element in the released state due to the voltage level being at a level 522 below the release voltage ($V_{rel}$) of the display element. The waveform 520 then ramps up to a level 524 above the actuation voltage level ($V_{act}$) and then ramps down to a level 526 below the $V_{rel}$ level. Thus the display element transitions from the released state to the actuated state and back to the released state faster than can be detected by the user.

Other waveform shapes such as square waves, and sinusoidal waves, for example, can be applied at the block 502 in the method 500. The specific waveforms chosen may depend on the specific technology and choice of algorithm. The mechanism to apply the waveform may be similar to those described above in reference to FIG. 8.

While the voltage waveform is being applied at the block 502, the feedback circuitry (e.g., the trans-impedance amplifier 120) is monitored at block 504 to measure an electrical response of the display element in response to the applied waveform. As discussed above in reference to the methods illustrated in FIGS. 10A, 10B and 10C, an electrical current of the display element can be monitored to determine if and when an element is released and/or actuated in response to a given voltage level and/or voltage ramp rate. In FIG. 15, the sensed current typically exhibits a peak 528 when the voltage level exceeds $V_{act}$ and another peak 530 when the voltage declines below $V_{rel}$. The current peak 528 is indicative that the display element has transitioned from the released state to the actuated state. The current peak 530 is indicative that the display element has transitioned back to the released state. The timing of the sensed current peaks exhibit different characteristics depending on the timing of the actuation and/or release of the display element in response to the applied voltage waveform.

The feedback circuitry discussed above in reference to FIG. 8 may by used to measure the electrical response at the block 204. The array driver 112 receives information indicative of the electrical response measured at the block 504, and at block 506 determines at least one operational characteristic of the display element based on the measured electrical response. The response time of the display element may be determined at the block 506. The response time may vary based on the applied peak voltage level and/or the voltage ramp rate. In addition, the operational characteristic may include one or more of release voltage levels, actuation voltage levels and bias voltage levels. These voltage levels may also vary as a function of temperature of the display element, age of the display element, etc.

At optional block 508, the array driver 112 may store information indicative of the operational characteristic determined at the block 506 and store information indicative of the voltage levels applied at the block 502 to which the operational characteristics correspond. The voltage level information stored at the block 508 may include peak voltage levels, voltage ramp rate, voltage waveform shape, voltage waveform time duration, and others. The operational characteristics information stored at the block 508 can include response time to actuate or release the display element, actuation voltage levels, release voltage levels, bias voltage levels, etc. Release and actuation voltage levels may also be a function of the ramped voltage rate of the waveform, and this information may also be stored at the block 508.

After information has been stored at the block 508, the method 500 optionally continues to block 510, where the array driver 112 can determine a drive voltage level and/or ramp rate to apply to a display element based on the information stored at the block 508 and a desired operational characteristic. In one embodiment, the operational characteristic may simply be actuation or release of the display element in order to adapt these voltage levels to changing environmental conditions or age of the interferometric modulator 12. In this embodiment, the processor or array driver may determine the minimum voltage amplitude to actuate the display element. In another embodiment, the operational characteristic may be a desired response time. In this embodiment, the voltage level and/or the voltage ramp rate that best provides the desired response time is determined at the optional block 510.

The functions performed at the block 502, 504, 506, and optionally 508 may be performed on a periodic basis, on a pseudorandom basis, based on a temperature level or change in temperature of the display element or display device, based on the age of the display element, or other basis.

The determination of drive voltage levels at the optional block 510 may be performed just prior to the array driver 112 signaling the display elements to display image data during the normal image writing phase. The determination of drive voltage levels at the optional block 510 may also be performed on a periodic basis, on a pseudorandom basis, based on a temperature level or change in temperature of the display element or display device, or based on the age of the display element.

Each of the methods discussed above in reference to FIGS. 10A, 10B, 10C and 14 involve measuring an electrical response of a display element. There are various methods of sensing different portions of a display array of display elements. For example, it may be chosen to sense an entire display array in one test. In other words, feedback signals from all the row electrodes (or column electrodes) may always be electrically connected to the trans-impedance amplifier 120 shown in FIG. 8. In this case, the timing of the column electrodes being signaled, and the rows being signaled, may be synchronized by the array driver such that individual display elements, pixels or sub-pixels (e.g., red, green and blue sub-pixels) may be monitored at certain times. It may also be chosen to monitor or measure one or more specific row or column electrodes at one time and optionally switch to monitor other row and column electrodes at other times, and repeating with different rows and/or columns until the entire array is monitored. Finally, it may also be chosen to measure individual display elements and optionally switch to monitor or measure the other display elements until the entire array is measured.

In one embodiment, one or more selected row or columns electrodes may be permanently connected to the stimulus and/or sense circuitry while the remaining row or columns electrodes are not connected to the stimulus and/or sense circuitry. In some embodiments, extra electrodes (row or column) are added to the display area for the purpose of applying the stimulus or sensing. These additional electrodes may or may not be visible to a viewer of the display area. Finally, another option is to connect and disconnect the stimulus/drive and/or sense circuitry to a different set of one or more row or column electrodes via switches or alternative electrical components.

Embodiments of the systems and methods discussed above may be applied to monochrome, bi-chrome, or multicolor displays. In some embodiments, groups of pixels for different colors are measured by suitable choice of row and column electrodes. For example, if the display uses an RGB layout where Red (R), Green (G), and Blue (B) sub-pixels are located on different column lines, areas of individual colors may be measured via application of stimulus only to the 'Red' columns and sensing on the rows. Alternatively, the stimulus may be applied to the rows, but sensed only on the 'Red' columns.

In many display technologies, application of a drive pulse on a given row or column may result in undesirable effects on neighboring rows or columns. This undesirable effect is commonly called crosstalk. Crosstalk affects many display technologies including IMOD, LCD and OLED. In one embodiment, sensing or feedback circuitry is provided to sense existence of these undesirable effects and compensate. The signal from the area of interest can be isolated from the signal or interference from other regions of a display via various methods.

Figure 16A:
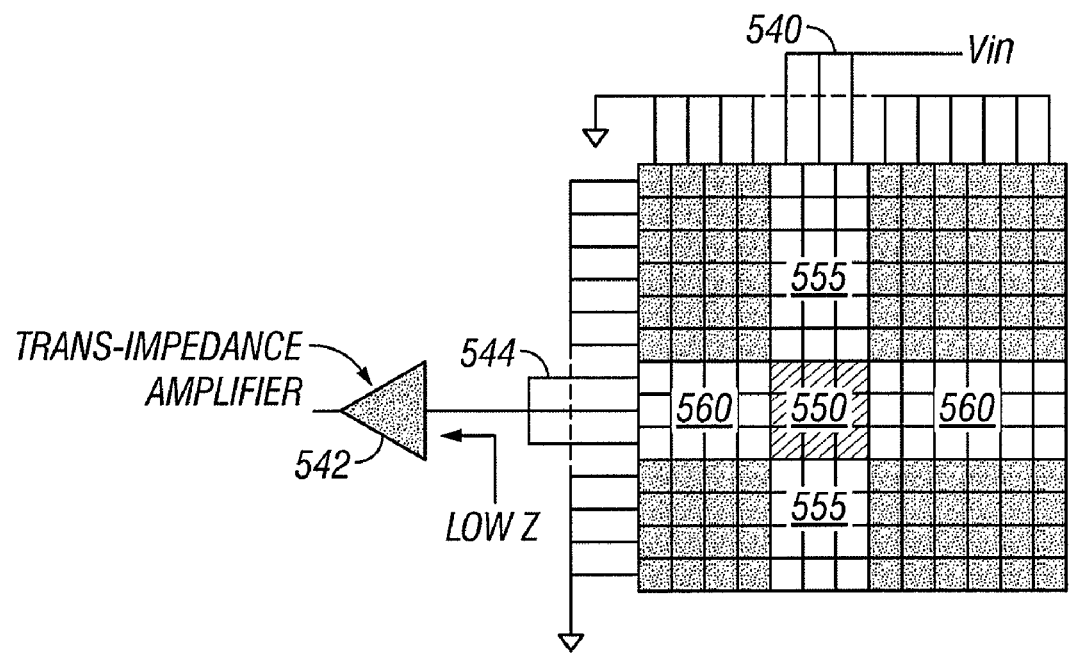
FIG. 16A is a block diagram illustrating an example of circuitry for driving an isolated portion of a display array and for sensing an electrical response of the isolated area.

FIG. 16A is a block diagram illustrating an example of circuitry for driving an isolated portion of a display array and for sensing an electrical response of the isolated area. A voltage stimulus $V_{in}$ is applied to a selected set of column electrodes 540 and a current signal is sensed via a trans-impedance amplifier 542 with low input impedance (Z) from a selected set of row electrodes 544. Thus, a display area 550 is sensed. Display areas 555 and 560 are portions of the column electrodes 540 and the row electrodes 544, respectively, which are not sensed.

Figure 16B:
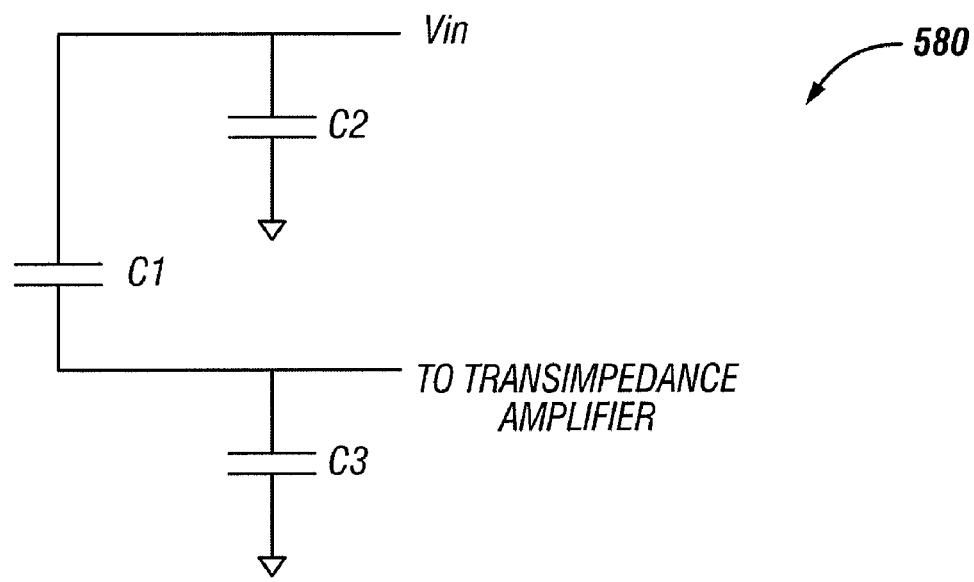
FIG. 16B illustrates an equivalent circuit illustrating the electrical relationship of capacitance of a display area being sensed, and capacitances of other display areas not being sensed.

FIG. 16B illustrates a circuit 580 illustrating the electrical relationship of capacitance of the display area 550 sensed, and the capacitances of the display areas 555 and 560 not sensed. Capacitor C2 represents the capacitance of the display area 555, C3 represents that of the display area 560 and C1 represents that of the display area 550 that is isolated and sensed. The current consumed by C2 is supplied by $V_{in}$ and goes directly to ground. The current through C1, that is the desired current to be sensed, is also supplied by $V_{in}$, but may be affected by the capacitance C3 before it reaches the trans-impedance amplifier 542. However, the current through C1 may be forced to go almost entirely to the trans-impedance amplifier 542 via choice of an appropriately low input impedance of the trans-impedance amplifier 542 as compared to the impedance of the capacitance C3. In this case, there is substantially no signal current via C3. Thus, from the example circuit 580, only the current through C1, the area 555, is sensed by the amplifier. Any area of the display can be selected via corresponding choice of the row and column electrodes. Note that in the example circuitry of FIG. 16B, the remaining electrodes not included in the isolated area 550 are depicted as being connected to ground, however, they could be connected to any voltage level.

While the above detailed description has shown, described, and pointed out novel features as applied to various embodiments, it will be understood that various omissions, substitutions, and changes in the form and details of the device or process illustrated may be made without departing from that which has been disclosed. As will be recognized, the present invention may be embodied within a form that does not provide all of the features and benefits set forth herein, as some features may be used or practiced separately from others.

What is claimed is:

1. A method, comprising:
    applying a signal waveform across a first electrode and a second electrode of a device, wherein the signal alters a state of the device from a first state to a second state and back to the first state, wherein the transition from the first state to the second state and back to the first state has a duration which causes the transition to be substantially undetectable to a viewer;
    measuring an electrical response of the device in response to the applied signal; and
    determining at least one operational characteristic of the device based on the measured electrical response.

2. The method of claim 1, wherein the transition from the first state to the second state and back to the first state is completed in less than 400 microseconds.

3. The method of claim 1, wherein the transition from the first state to the second state and back to the first state is completed in more than about 400 microseconds and less than about 4000 microseconds.

4. The method of claim 1, further comprising repeating the applying, measuring and determining on a periodic time basis.

5. The method of claim 1, further comprising repeating the applying, measuring and determining on a pseudorandom time basis.

6. The method of claim 1, further comprising repeating the applying, measuring and determining at a time based on a temperature change.

7. The method of claim 1, further comprising performing the applying, measuring and determining based on an age of the device.

8. The method of claim 1, wherein applying the signal waveform is performed multiple times at various voltages and an operational characteristic is determined for each of the various voltages, the method further comprising:
    storing information indicative of the operational characteristic and the voltage level for each of the various voltages, and
    determining a drive voltage level based on the stored information and a predetermined operational characteristic.

9. The method of claim 1, wherein determining the at least one operational characteristic comprises determining one or more of an actuation voltage, a release voltage and a response time.

10. The method of claim 1, wherein the voltage waveform comprises one or more of a sinusoid, a saw tooth and a rectangular pulse.

11. An apparatus, comprising:
    drive circuitry configured to apply a signal across a first electrode and a second electrode of a device, wherein the signal alters a state of the device from a first state to a second state and back to the first state, wherein the transition from the first state to the second state and back to the first state has a duration which causes the transition to be substantially undetectable to a viewer;
    feedback circuitry configured to measure an electrical response of the device in response to the applied voltage waveform; and
    a processor configured to control the drive circuitry, receive information indicative of the measured electrical response, and determine at least one operational characteristic of the device based on the measured electrical response.

12. The apparatus of claim 11, wherein the transition from the first state to the second state and back to the first state is completed in less than 400 microseconds.

13. The apparatus of claim 11, wherein the transition from the first state to the second state and back to the first state is completed in more than about 400 microseconds and less than about 4000 microseconds.

14. The apparatus of claim 11, wherein the processor is configured to control the drive circuitry to apply the signal on a periodic time basis.

15. The apparatus of claim 11, wherein the processor is configured to control the drive circuitry to apply the signal on a pseudorandom time basis.

16. The apparatus of claim 11, wherein the processor is configured to control the drive circuitry to apply the signal at a time based on a temperature change.

17. The apparatus of claim 11, wherein the processor is configured to control the drive circuitry to apply the signal based on the age of the device.

18. The apparatus of claim 11, wherein the processor is configured to control the drive circuitry to apply the signal multiple times at various levels, determine an operational characteristic associated with each of the multiple levels, store information indicative of the operational characteristics and the levels, and determine a drive level based on the stored information and a predetermined operational characteristic.

19. The apparatus of claim 18, wherein the at least one operational characteristic comprises one or more of an actuation voltage, a release voltage and a response time.

20. The apparatus of claim 11, wherein the signal comprises one or more of a sinusoid, a saw tooth and a rectangular pulse.

21. The apparatus of claim 11, wherein the processor is configured to control the drive circuitry to apply the voltage waveform to provide temporal averaging of a displayed color.

22. A device, comprising:
    means for applying a signal across a first electrode and a second electrode of the device, wherein the signal alters a state of the device from a first state to a second state and back to the first state, wherein the transition from the first state to the second state and back to the first state has a duration which causes the transition to be substantially undetectable to a viewer;
    means for measuring an electrical response of the device in response to the applied signal; and means for receiving information indicative of the measured electrical response and for determining at least one operational characteristic of the device based on the measured electrical response.

23. The device of claim 22, wherein the transition from the first state to the second state and back to the first state is completed in less than 400 microseconds.

24. The device of claim 22, wherein the transition from the first state to the second state and back to the first state is completed in more than about 400 microseconds and less than about 4000 microseconds.

25. The device of claim 22, wherein the applying means is configured to apply the signal at a time based on a temperature change.

26. The device of claim 22, wherein the applying means is configured to apply the signal at a time based on an age of the device.

27. The device of claim 22, the wherein the applying means is configured to apply the signal multiple times at various voltages and the means for receiving is configured to determine an operational characteristic for each of the various signals, the device further comprising:
   means for storing information indicative of the operational characteristic and the voltage level for each of the various voltages, and
   means for determining a drive voltage level based on the stored information and a predetermined operational characteristic.

28. The device of claim 22, wherein the means for receiving is configured to determine one or more of an actuation voltage, a release voltage and a response time.

29. A device comprising:
   an array of interferometric modulators;
   drive circuitry configured to apply a signal across a first electrode and a second electrode of at least one of the interferometric modulators, wherein the signal alters a state of the interferometric modulator from a first state to a second state and back to the first state, wherein the transition from the first state to the second state and back to the first state has a duration which causes the transition to be substantially undetectable to a viewer;
   feedback circuitry configured to measure an electrical response of the interferometric modulator in response to the applied voltage waveform;
   a processor configured control the drive circuitry, receive information indicative of the measured electrical response, and determine at least one operational characteristic of the interferometric modulator based on the measured electrical response; and
   a memory device configured to communicate with the processor.

30. The device of claim 29, further comprising a controller configured to send at least a portion of the image data to the drive circuitry.

31. The device of claim 29, further comprising an image source module configured to send the image data to the processor.

32. The device of claim 31, wherein the image source module comprises at least one of a receiver, transceiver, and transmitter.

33. The device of claim 29, further comprising an input device configured to receive input data and to communicate the input data to the processor.

* * * * *